(12) United States Patent
Pang et al.

(10) Patent No.: US 8,674,442 B2
(45) Date of Patent: Mar. 18, 2014

(54) SEMICONDUCTOR DEVICE AND MANUFACTURING METHOD THEREOF

(75) Inventors: Yon-sup Pang, Chungcheongbuk-do (KR); Jun-ho Lee, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 305 days.

(21) Appl. No.: 12/947,763

(22) Filed: Nov. 16, 2010

(65) Prior Publication Data

US 2012/0007179 A1    Jan. 12, 2012

(30) Foreign Application Priority Data

Jul. 9, 2010  (KR) .................. 10-2010-0066427

(51) Int. Cl.
*H01L 29/78*    (2006.01)

(52) U.S. Cl.
USPC ............... 257/344; 257/346; 257/E21.409; 257/E21.437; 257/E29.269; 438/286; 438/289

(58) Field of Classification Search
USPC ............. 257/344, 346, E21.409, E21.437, 257/E29.255, E29.269
See application file for complete search history.

(56) References Cited

U.S. PATENT DOCUMENTS

| | | | |
|---|---|---|---|
| 5,854,566 A | 12/1998 | Kwon et al. | |
| 6,160,289 A | 12/2000 | Kwon et al. | |
| 6,559,683 B1 | 5/2003 | Kwon et al. | |
| 7,385,253 B2 | 6/2008 | Kim | |
| 2005/0173765 A1 | 8/2005 | Kim | |
| 2009/0142898 A1* | 6/2009 | Chou et al. | 438/286 |
| 2009/0283825 A1 | 11/2009 | Wang et al. | |
| 2010/0159659 A1* | 6/2010 | Matsudai et al. | 438/286 |

FOREIGN PATENT DOCUMENTS

| | | |
|---|---|---|
| KR | 100202635 | 3/1999 |
| KR | 1020030087739 | 11/2003 |
| KR | 1020050079542 | 8/2005 |

* cited by examiner

*Primary Examiner* — Mamdou Diallo
(74) *Attorney, Agent, or Firm* — Blakely Sokoloff Taylor & Zafman

(57) ABSTRACT

A high voltage/power semiconductor device using a low voltage logic well is provided. The semiconductor device includes a substrate, a first well region formed by being doped in a first location on a surface of the substrate, a second well region formed by being doped with impurity different from the first well region's in a second location on a surface of the substrate, an overlapping region between the first well region and the second well region where the first well region and the second well region substantially coexist, a gate insulating layer formed on the surface of the first and the second well regions and the surface of the overlapping region, a gate electrode formed on the gate insulating layer, a source region formed on an upper portion of the first well region, and a drain region formed on an upper portion of the second well region. The semiconductor device may also include a separating unit, which is formed in the second well region on the drain side and may be formed as a shallow trench isolation (STI) region having a lower depth than the second well region.

18 Claims, 32 Drawing Sheets

FIG. 15

| | $V_{Text}$ [V] at $V_{DS}=0.1V$ | $R_{sp}$ [mΩ-mm²] at $V_{GS}=5V$, $V_{DS}=0.1V$ | $I_{Dsat1}$ [μA/μm] at $V_{GS}=5V$, $V_{DS}=5V$ | $I_{Dsat2}$ [μA/μm] at $V_{GS}=5V$, $V_{DS}=10V$ | BVDSS[V] at $V_{GS}=0V$, $I_D=1\times10^{-9}$ [A/μm] | BVDSN[V] at $V_{GS}=5V$, $I_D=1.25\times I_{Dsat1}$ | $I_{off1}$ [A/μm] at $V_{GS}=0V$, $V_{DS}=5V$ | $I_{off2}$ [A/μm] at $V_{GS}=0V$, $V_{DS}=10V$ |
|---|---|---|---|---|---|---|---|---|
| FIRST EXEMPLARY EMBODIMENT (nEDMOS #2) | 0.749 | 7.45 | 549 | 546 | 15.0 | 17.1 | 1.24×10⁻¹³ | 2.36×10⁻¹³ |
| SECOND EXEMPLARY EMBODIMENT (nEDMOS #1) | 0.829 | 6.70 | 484 | 506 | 15.0 | 15.0 | 2.45×10⁻¹³ | 5.02×10⁻¹³ |

SEMICONDUCTOR DEVICE AND MANUFACTURING METHOD THEREOF

CROSS-REFERENCE TO RELATED APPLICATIONS

This application claims priority from Korean Patent Application No. 2010-66427, filed in the Korean Intellectual Property Office on Jul. 9, 2010, the disclosure of which is incorporated herein by reference.

BACKGROUND OF THE INVENTION

1. Field of the Invention

Aspects of the exemplary embodiments relate a semiconductor device and a manufacturing method thereof, and more particularly, to a semiconductor device in which the electrical characteristics of high voltage/power devices are improved, using low voltage logic wells and a manufacturing method thereof.

2. Description of the Prior Art

As demand for small-scale multi-functional electronic devices is increasing with the development of electronic technology, System-on-a-chip (SOC) technology is introduced. SOC is a technology which integrates a plurality of electronic components having different characteristics into a single chip to implement a single system.

Modern power integrated circuits have high-voltage/power devices such as EDMOS and LDMOS integrated with low-voltage logic devices on a single chip. The process for integrating those two different types of devices on a SOC chip is very complicated and costly.

Thus, forming high voltage/power devices requires a long thermal process and additional mask steps, and the process can affect characteristics of logic devices which are used in a circuit operating at a low voltage.

Recently, in order to form high voltage/power and low voltage/logic devices through a single process, a high voltage/power device such as an extended drain metal oxide semiconductor (EDMOS) have been implemented in CMOS logic technology. Research has been conducted to replace the high voltage well of an EDMOS with the logic well of a low voltage device.

However, in case the length of the drift region near the silicon surface of EDMOS, e.g., the length of drift region between the channel region and RESUEF (Reduced Surface Electric Field) STI (Shallow Trench Isolation) is extremely short, it is very difficult to raise both breakdown voltage and device performance (speed), or to raise breakdown voltage as well as to lower the specific on-resistance.

SUMMARY OF THE INVENTION

Aspects of the exemplary embodiments relate to a semiconductor device in which the electrical characteristics of high voltage/power are improved, using a low voltage logic well and a manufacturing method thereof.

A semiconductor device, according to an exemplary embodiment, includes a substrate, a first well region formed by being doped in a first location on a surface of the substrate, a second well region formed by being doped in a different type from the first well region in a second location on a surface of the substrate, an overlapping region between the first and the second well regions where the first and the second well regions substantially coexist, a gate insulating layer formed on the first and the second well regions extending over a surface of the overlapping region, a gate electrode formed on the insulating layer, a source region formed on an upper portion of the first well region, and a drain region formed on an upper portion of the second well region.

The overlapping region may have width of 0.2 to 0.7.

The overlapping region has lower net doping concentration than the first and the second well regions.

The overlapping region has net doping concentration which decreases gradually from the boundary between the first well and overlapping region to the boundary between the second well and overlapping region.

The shape of the junction boundary of the overlapping region is a changing curvature caused by the doping compensation in the non-uniformly doped logic n- and p-wells. The net doping concentration at the overlapping region decreases from the first well boundary to the second well boundary. The slope of the net doping concentration in the horizontal, i.e., the channel-length direction at the overlapping region changes high, low and then high towards the second well region.

The semiconductor device may further include an LDD region disposed of next to the source region. The LDD region is doped with the same type dopant (impurity) as the source region's and has lower doping concentration than the source region. The LDD region is located at least partially under the gate.

The semiconductor device may further include an isolating oxide region disposed of next to the drain region.

The isolating oxide region may be a shallow trench isolation (STI) region having lower depth than the second well region.

A method for manufacturing the semiconductor device, according to an exemplary embodiment, includes the first and the second well regions doped with different type dopants, and an overlapping region where the first and the second well regions overlap each other. A gate insulating layer is disposed of on the overlapping, the first and the second well regions. A gate electrode is disposed of on the insulating layer, and the source and drain regions are heavily doped by performing low energy arsenic and phosphorus dopant ion implantation.

The first and the second well regions are relatively lightly doped by performing boron and indium dopant (the first well), and phosphorus and arsenic dopant (the second well) ion implantation several times, using high and low energy. The dopant concentration of the first and the second logic wells is higher than that of high-voltage wells.

BRIEF DESCRIPTION OF THE DRAWINGS

The above and/or other aspects of the present disclosure will be more apparent by describing certain present disclosure with reference to the accompanying drawings, in which:

FIG. 15 is a table showing the comparison of the electrical characteristics of the semiconductor device (nEDMOS #2) of the first exemplary embodiment with the electrical characteristics of the semiconductor device (nEDMOS #1) of the second exemplary embodiment;

DETAILED DESCRIPTION

Figure 1:
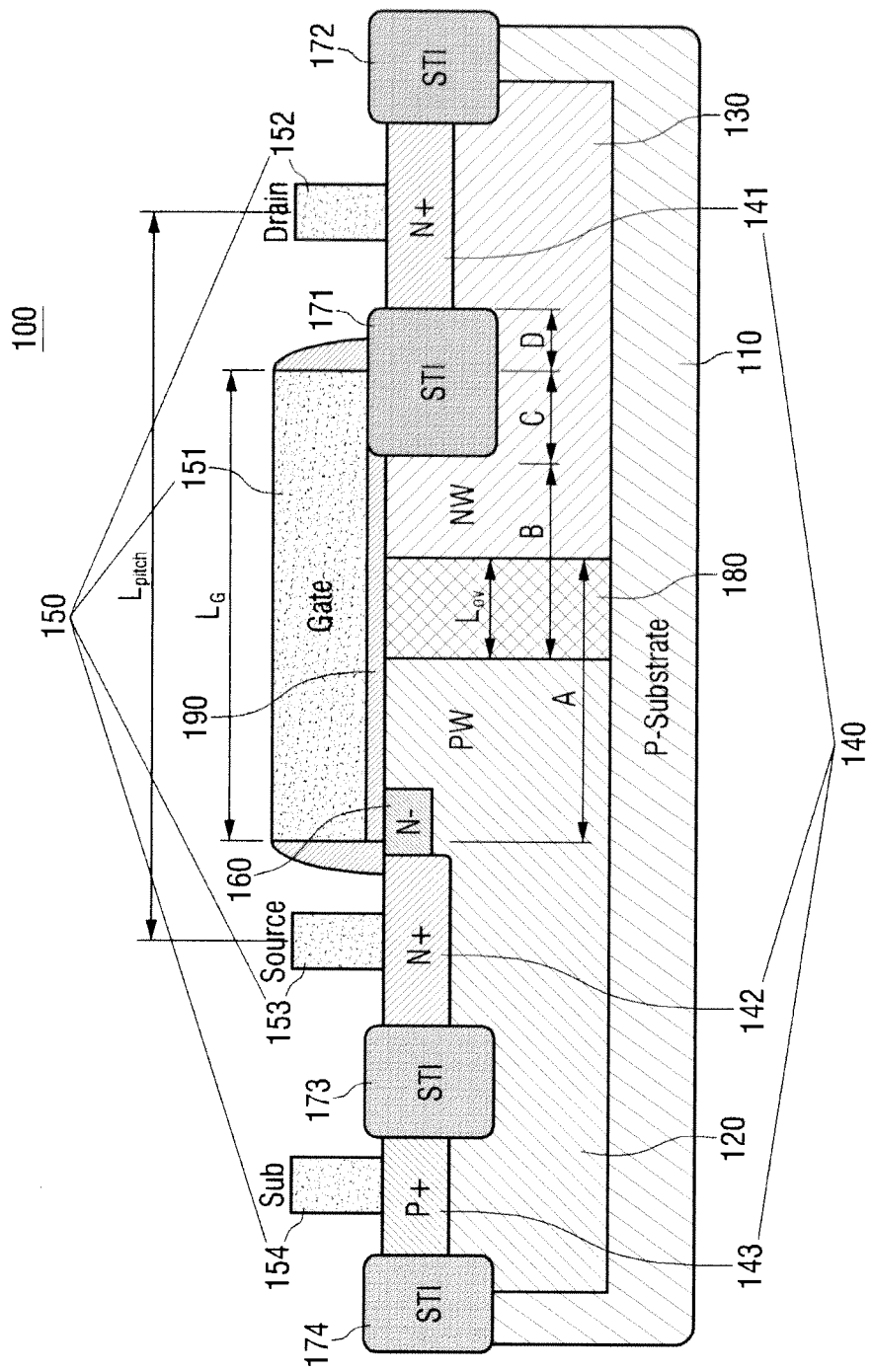
FIG. 1 is a cross-sectional view illustrating the structure of the semiconductor device according to an exemplary embodiment.

Certain exemplary embodiments are described in more detail below with reference to the accompanying drawings.

In the following description, like drawing reference numerals are used for the like devices, even in different drawings. The matters defined in the description, such as detailed construction and devices, are provided to assist in a comprehensive understanding of exemplary embodiments. However, exemplary embodiments can be practiced without those specifically defined matters. Also, well-known functions or constructions are not described in detail since they would obscure the application with unnecessary detail.

First Exemplary Embodiment

FIG. 1 is a cross-sectional view illustrating the structure of a semiconductor device of the exemplary embodiment.

Referring to FIG. 1, the semiconductor device 100 comprises a substrate 110, the first well region 120, the second well region 130, a heavily doped region 140, an electrode 150, an LDD region 160, a RESURF (Reduced SURface Field) STI (Shallow Trench Isolation) region 171, an overlapping region 180 and a gate insulating layer 190. The semiconductor device 100 of the exemplary embodiment is an EDMOS device.

The region 110 is p-type and highly resistive silicon substrate.

The first well region 120 is a low voltage P-well which is formed as a p-type dopant is implanted onto the surface of the substrate 110 of the regions 120 and 180. Specifically, the first well region 120 is a low voltage P-well which is doped with a p-type dopant such as boron and indium.

The second well region 130 is a low voltage N-well which is formed as a n-type dopant is implanted onto the surface of the substrate 110 of the region 130 and 180. Specifically, the second well region 130 is a low voltage N-well which is doped with an n-type dopant such as phosphorous and arsenic. Although high voltage/power devices have been fabricated, using high-voltage wells, this patent shows that a high voltage/power device can be implemented in the process for logic well-based devices.

The heavily doped region 140 comprises a drain region 141, a source region 142, and a substrate region 143. The drain region 141 and the source region 142 are doped with N-type dopants just like in the second well region 130, and the substrate region 143 is doped with a P-type dopant just like in the first well region 120.

The electrode 150 is to electrically connect the doped region 140 to an external device and comprises a gate electrode 151, a drain electrode 152, a source electrode 153 and a substrate electrode 154.

The gate electrode 151 is formed on an upper portion of the insulating layer 190 and can form a channel layer on the surface of the first well region 120 and an accumulation layer on the second well region 130 if gate voltage greater than the threshold voltage is applied to the gate electrode.

The drain electrode 152 is formed on an upper portion of the drain region 141, the source electrode 153 is formed on an upper portion of the source region 142, and the substrate electrode 154 is formed on an upper portion of the substrate region 143.

A lightly doped drain (LDD) region 160 is an N-region to reduce an electric field which is formed by a gate by lowering doping concentration locally. Specifically, the LDD region 160 which is located next to a source region and beneath some portion of a gate, is a region in which an N-type dopant is doped with concentration lower than that of the source region 142 just like in the second well region 130.

The separating unit 171 is an insulating layer formed on the side of the drain region 141 in the second well region 130. The separating unit has a shallow trench isolation (STI) region which in the second well region 130.

The overlapping region 180 is a region formed by overlapping the first well region 120 and the second well region 130 without using an additional mask. Specifically, the overlapping region 180 is a region where a p-type dopant such as boron, indium and an n-type such as phosphorous and arsenic coexist.

Figure 9:
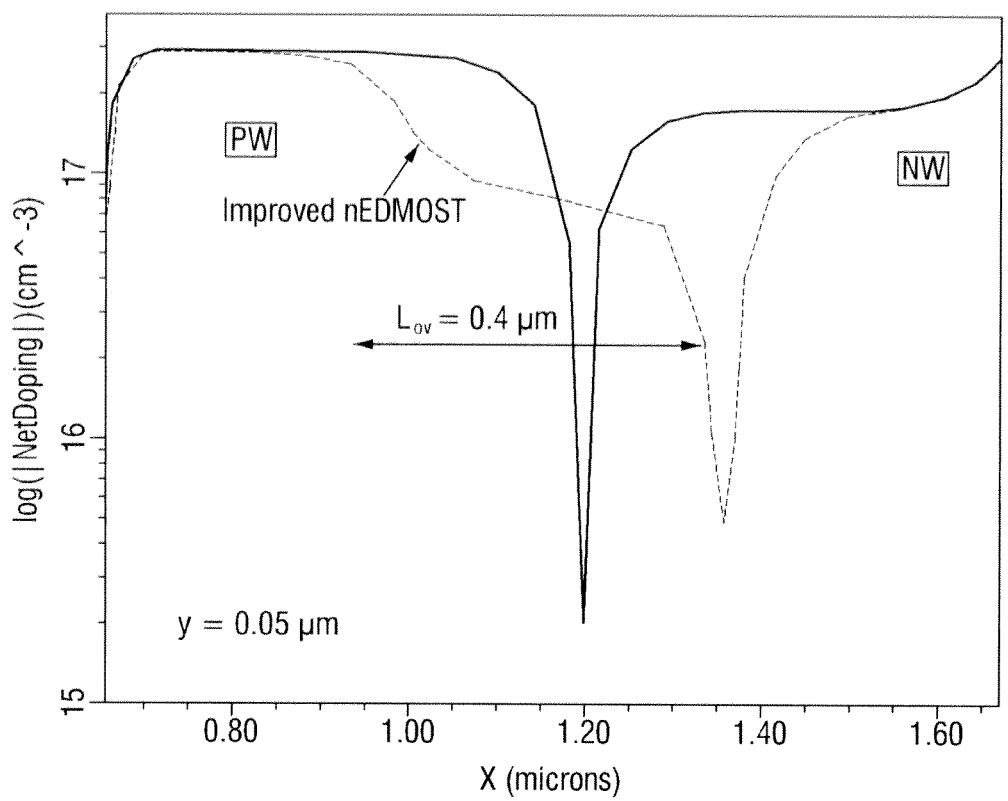

As such, since both the p-type dopant and the n-type dopant in the overlapping region 180, the net doping concentration is lower than those in the first well region 120 and the second well region 130 as illustrated in FIG. 9. Specifically, the net doping concentration in the overlapping region 180 decreases as the overlapping region 180 moves away from the boundary between the overlapping region and the first well region 120 towards the boundary between the overlapping region and the second well region 130. In addition, the overlapping region 180 has doping concentration which varies vertically.

The overlapping region 180 may have the length of 0.2 to 0.7 to design an nEDMOS with the gate length of $L_G$=1.25. The length of the overlapping region depends on the electrical parameter values, i.e., design targets of the nEDMOS. A, B, C, and D in FIG. 1 are parameters for designing devices. A refers to the distance between the left end of the gate and the right end of the first well region, B refers to the distance between the left end of the second well region 130 and the left end of the separating unit 171, C refers to the distance between the left end of the separating unit 171 and the right end of the gate, and D refers to the distance between the right end of the gate and the right end of the separating unit.

In addition, Lg refers to a gate length, Lov refers to the length of the region 180 where the first well region 120 and the second well region 130 overlap each other. In other words, Lg=A+B+C−Lov. If a semiconductor device is designed to have 0.18 μm in the exemplary embodiment, A and B may have the range of 0.7 μm to 1.2 μm, C and D may have 0.15 μm±10%, and the overlapping region 180 may have the width of 0.2 μm to 0.7 μm.

The insulating layer 190 insulates the gate electrode 151 from the substrate 110. Specifically, the insulating layer 190 as an oxide or a nitride layer may be formed on the upper portion of the first well region 120 and the second well region 130 of the substrate 110.

As such, the semiconductor device 100 in the exemplary embodiment includes the overlapping region 180 having a low doping level by overlapping the first well region and the second well region, and thus the electric characteristics of the EDMOS (device performance, leakage current, breakdown voltages, specific on-resistance) may be enhanced.

In addition, the semiconductor device 100 in the present invention includes the separating unit 171 in the vicinity of a drain region, and thus the BVDSS of EDMOS (breakdown voltage at $V_{GS}$=0V) and BVDSN of EDMOS (breakdown voltage at $V_{GS}$=5V) may be enhanced. Moreover, the semiconductor device 100 in the exemplary embodiment includes the LDD region 160 which is formed next to a source region, and thus current drivability and transconductance (gm) may increase.

In the above explanation regarding to FIG. 1, the source region 142 and the first well region 120 are formed on the left side of the semiconductor device 100, and the drain region 141 and the second well region 130 are formed on the right side of the semiconductor device, however, the location may change in other embodiments. In addition, in the above explanation regarding FIG. 1, the substrate region 143 and the substrate electrode 154 are included, but the semiconductor device may be formed without those two regions.

In addition, in the above explanation regarding FIG. 1, the semiconductor device 100 includes the overlapping region 180, but the semiconductor device may be formed without the overlapping region 180 as in the second exemplary embodiment and the third exemplary embodiment below.

In the above explanation regarding FIG. 1, the semiconductor device 100 includes the LDD region 160, but the semiconductor device may be formed without the LDD region 160 as in the fourth exemplary embodiment and the fifth exemplary embodiment below.

In the above explanation regarding FIG. 1, the semiconductor device 100 includes the separating unit 171, but the semiconductor device may be formed without the separating unit 171 as in the third exemplary embodiment, the fourth exemplary embodiment and the fifth exemplary embodiment below.

Second Exemplary Embodiment

Figure 2:
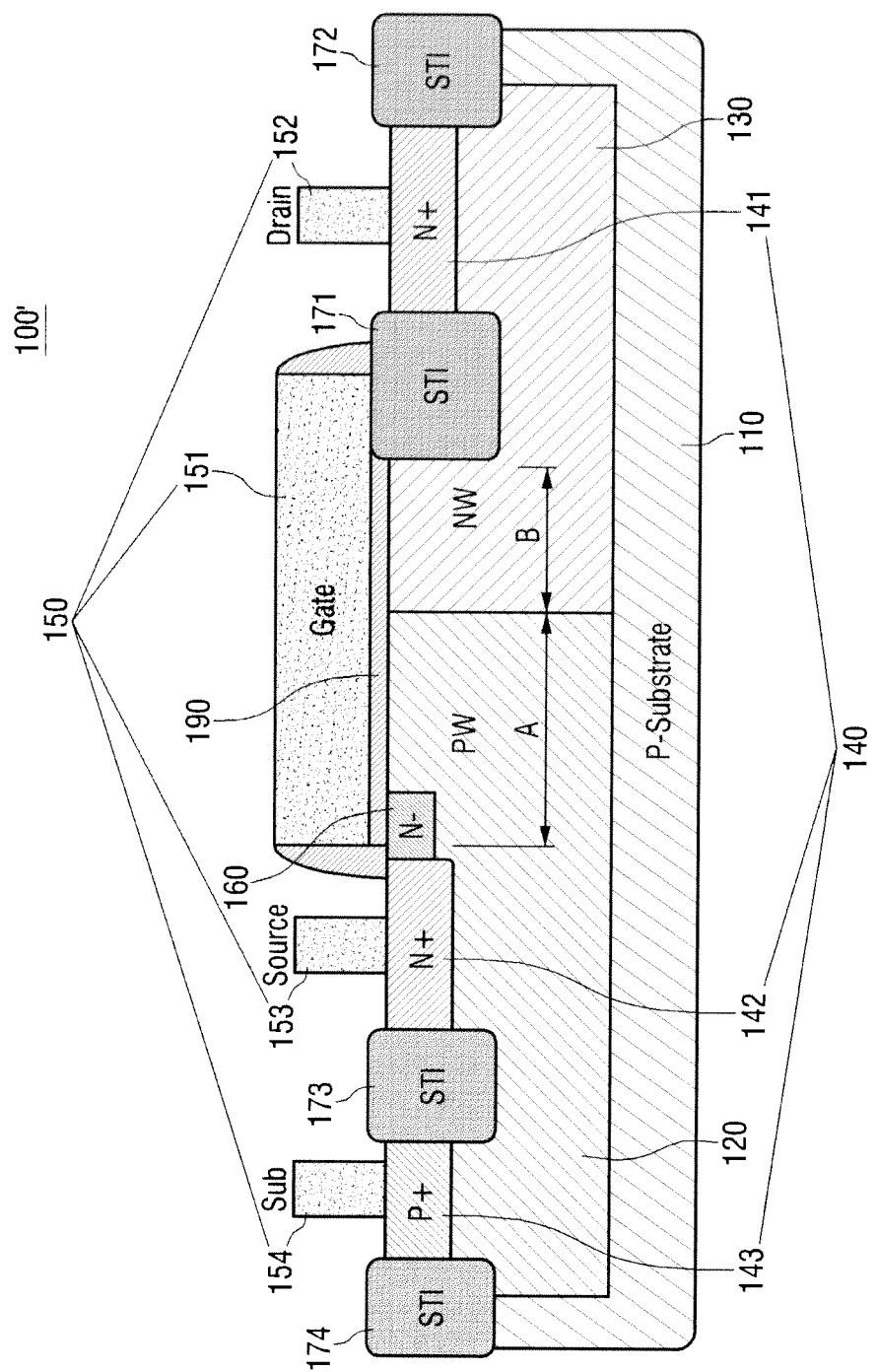
FIGS. 2 to 6 are cross-sectional views illustrating the structures of the semiconductor device according to another exemplary embodiment.

FIG. 2 is a cross-sectional view illustrating the structure of a semiconductor device according to a second exemplary embodiment.

Referring to FIG. 2, the semiconductor device 100' comprises the substrate 110, the first well region 120, the second well region 130, the doped region 140, the electrode 150, the LDD region 160, the separating region 171 and the gate insulating layer 190. Herein, the semiconductor device 100' is an EDMOS device.

The semiconductor device 100' in the second exemplary embodiment is distinct from the semiconductor device 100 in the first exemplary embodiment in that it does not have the overlapping region 180. Since the explanations regarding the substrate 110, the first well region 120, the second well region 130, the doped region 140, the electrode 150, the LDD region 160, the separating region 171 and the gate insulating layer 190 except for the overlapping region 180 have already been provided above, detailed description regarding them will no longer be provided.

As such, the semiconductor device 100' in the second exemplary embodiment includes the LDD region 160 which is formed next to the source region, and thus current drivability may be enhanced. In addition, since the separating unit 171 which is formed in the vicinity of the drain region is included. BVDSS of EDMOS (breakdown voltage at $V_{GS}$=0V) and BVDSN of EDMOS (breakdown voltage at $V_{GS}$=5V) may be enhanced.

Third Exemplary Embodiment

Figure 3:
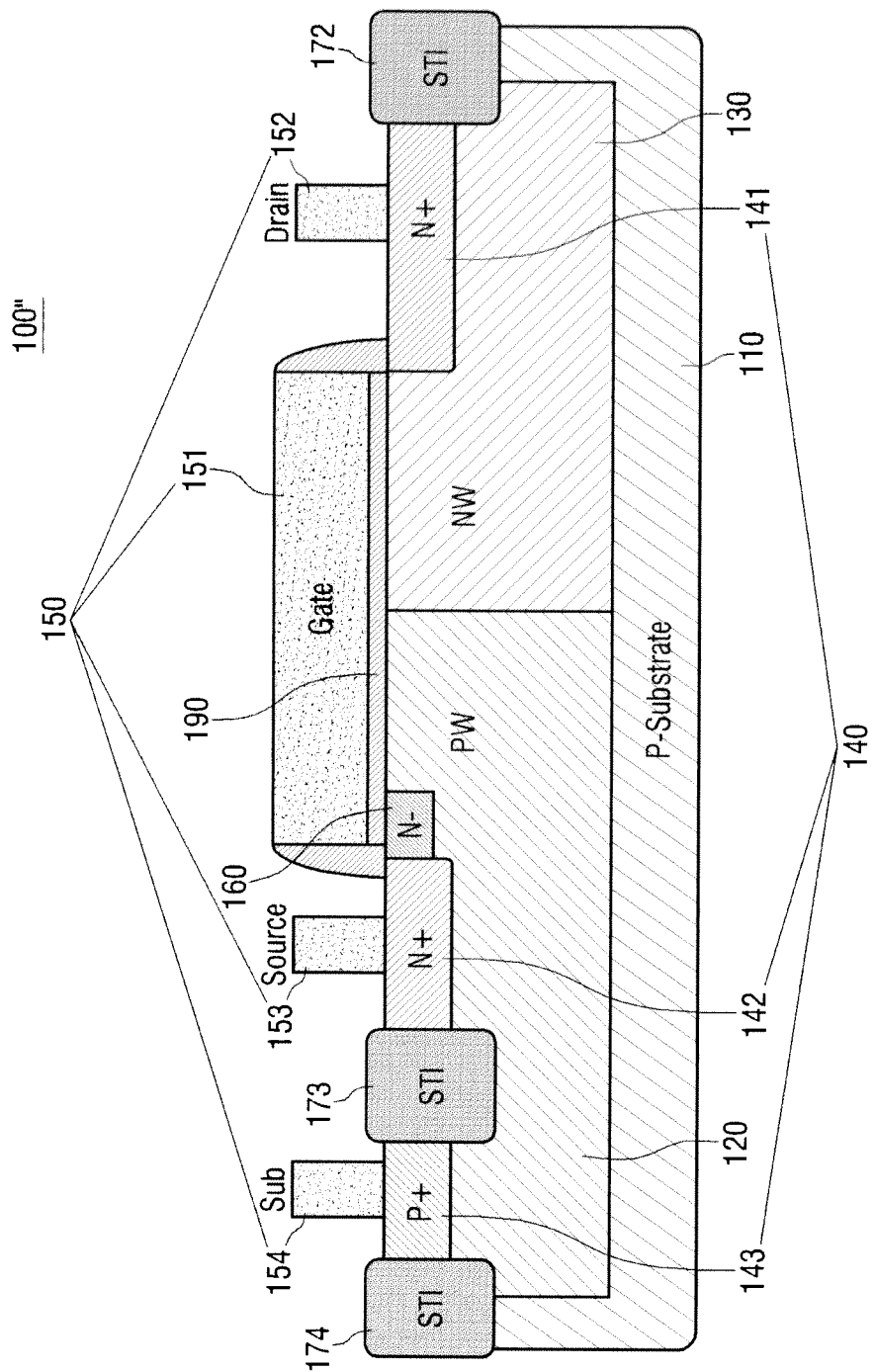

FIG. 3 is a cross-sectional view illustrating the structure of a semiconductor device according to a third exemplary embodiment.

Referring to FIG. 3, the semiconductor device 100" comprises the substrate 110, the first well region 120, the second well region 130, the doped region 140, the electrode 150, the LDD region 160 and the insulating layer 190. Herein, the semiconductor device 100" is an EDMOS device.

The semiconductor device 100" in the third exemplary embodiment is distinct from the semiconductor device 100 in the first exemplary embodiment in that it does not have the overlapping region 180 and the separating unit 171. Since the explanations regarding the substrate 110, the first well region 120, the second well region 130, the doped region 140, the electrode 150, the LDD region 160 and the gate insulating layer 190 except for the overlapping region 180 and the separating region 171 have already been provided above, detailed description regarding them will no longer be provided.

As such, the semiconductor device 100" in the third exemplary embodiment includes the LDD region 160 which is formed next to the source region, and thus current drivability may be enhanced.

Fourth Exemplary Embodiment

Figure 4:
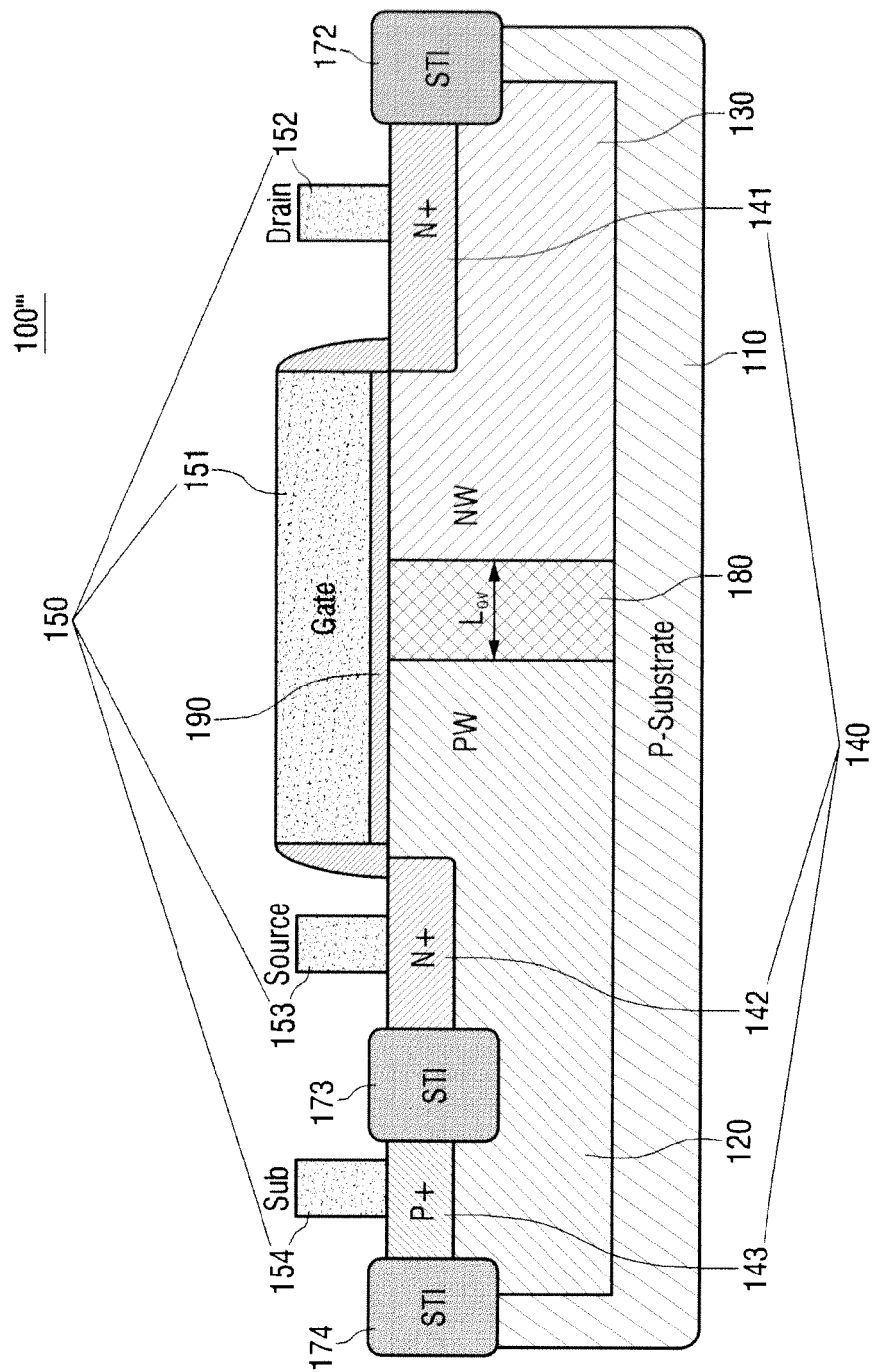

FIG. 4 is a cross-sectional view illustrating the structure of a semiconductor device according to a fourth exemplary embodiment.

Referring to FIG. 4, the semiconductor device 100''' comprises the substrate 110, the first well region 120, the second well region 130, the doped region 140, the electrode 150, the overlapping region 180, and the gate insulating layer 190. Herein, the semiconductor device 100''' is an EDMOS device.

The semiconductor device 100''' in the fourth exemplary embodiment is distinct from the semiconductor device 100 in the first exemplary embodiment in that it does not have the LDD region 160 and the separating unit 171. Since the explanations regarding the substrate 110, the first well region 120, the second well region 130, the doped region 140, the electrode 150, the overlapping region 180 and the gate insulating layer 190 except for the LDD region 160 and the separating unit 171 have already been provided above, detailed description regarding them will no longer be provided.

As such, the semiconductor device 100''' in the fourth exemplary embodiment includes the overlapping region 180 having a low doping level by overlapping the first well region and the second well region, and thus the electrical characteristics of EDMOS (device performance, leakage current, breakdown voltages, specific on-resistance) may be enhanced.

Fifth Exemplary Embodiment

Figure 5:
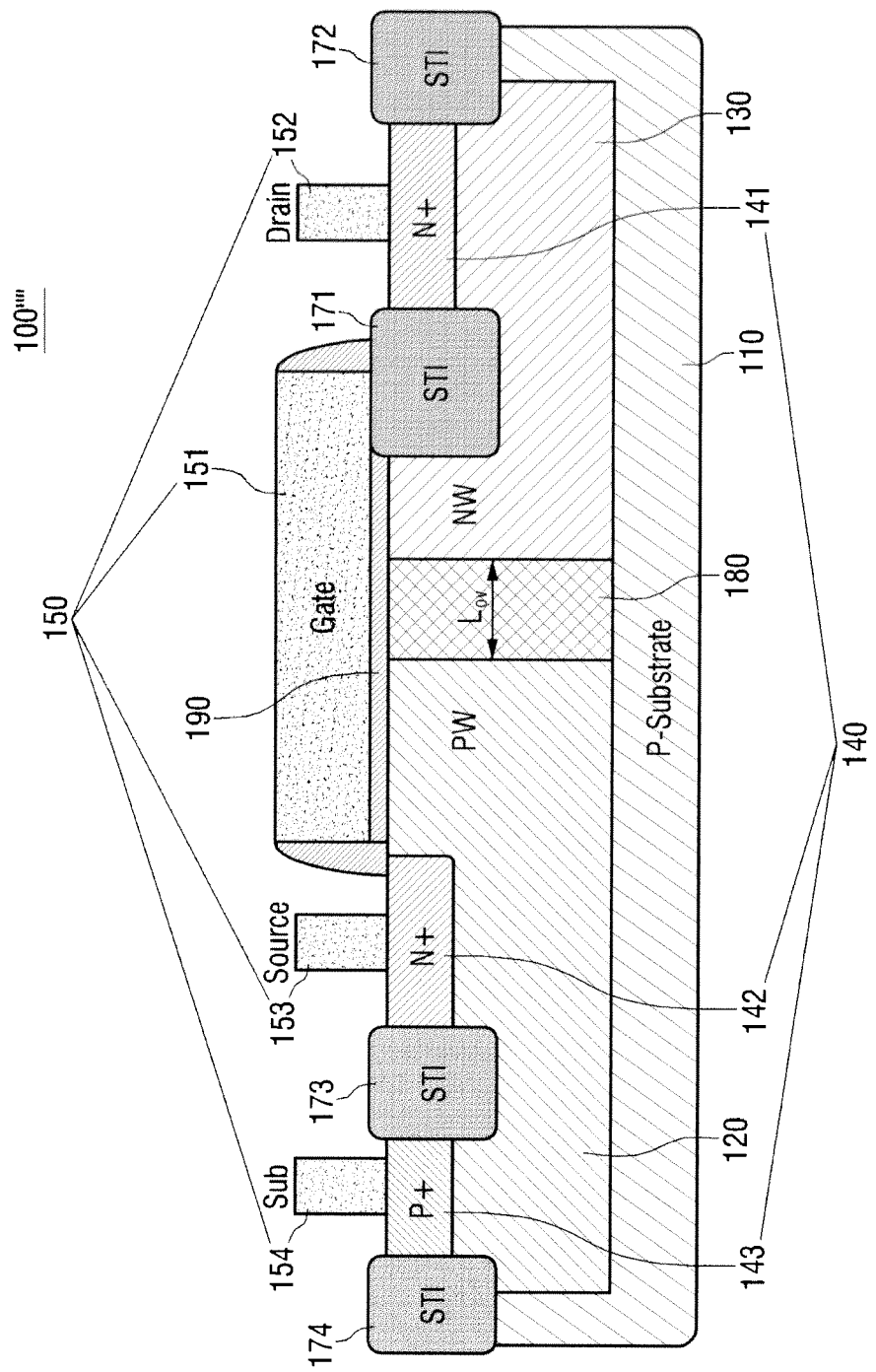

FIG. 5 is a cross-sectional view illustrating the structure of a semiconductor device according to a fifth exemplary embodiment.

Referring to FIG. 5, the semiconductor device 100'''' comprises the substrate 110, the first well region 120, the second well region 130, the doped region 140, the electrode 150, the separating unit 171, the overlapping region 180 and the gate insulating layer 190. Herein, the semiconductor device 100'''' is an EDMOS device.

The semiconductor device 100'''' in the fifth exemplary embodiment is distinct from the semiconductor device 100 in the first exemplary embodiment in that it does not have the LDD region 160. Since the explanations regarding the substrate 110, the first well region 120, the second well region 130, the doped region 140, the electrode 150, the overlapping region 180, the separating unit 171, and the gate insulating layer 190 except for the LDD region 160 have already been provided above, detailed description regarding them no longer be provided.

As such, the semiconductor device 100'''' in the fifth exemplary embodiment includes the overlapping region 180 having a low doping level by overlapping the first well region and the second well region, and thus the electrical characteristics of EDMOS (device performance, leakage current, breakdown voltages, specific on-resistance) may be enhanced. In addition, since the separating unit 171 which is disposed of in the vicinity of the drain region is included, the off- and on-state drain breakdown voltages, i.e., BVDSS (breakdown voltage at $V_{GS}$=0V) and BVDSN (breakdown voltage at $V_{GS}$=5V) of EDMOS may be enhanced.

Sixth Exemplary Embodiment

Figure 6:
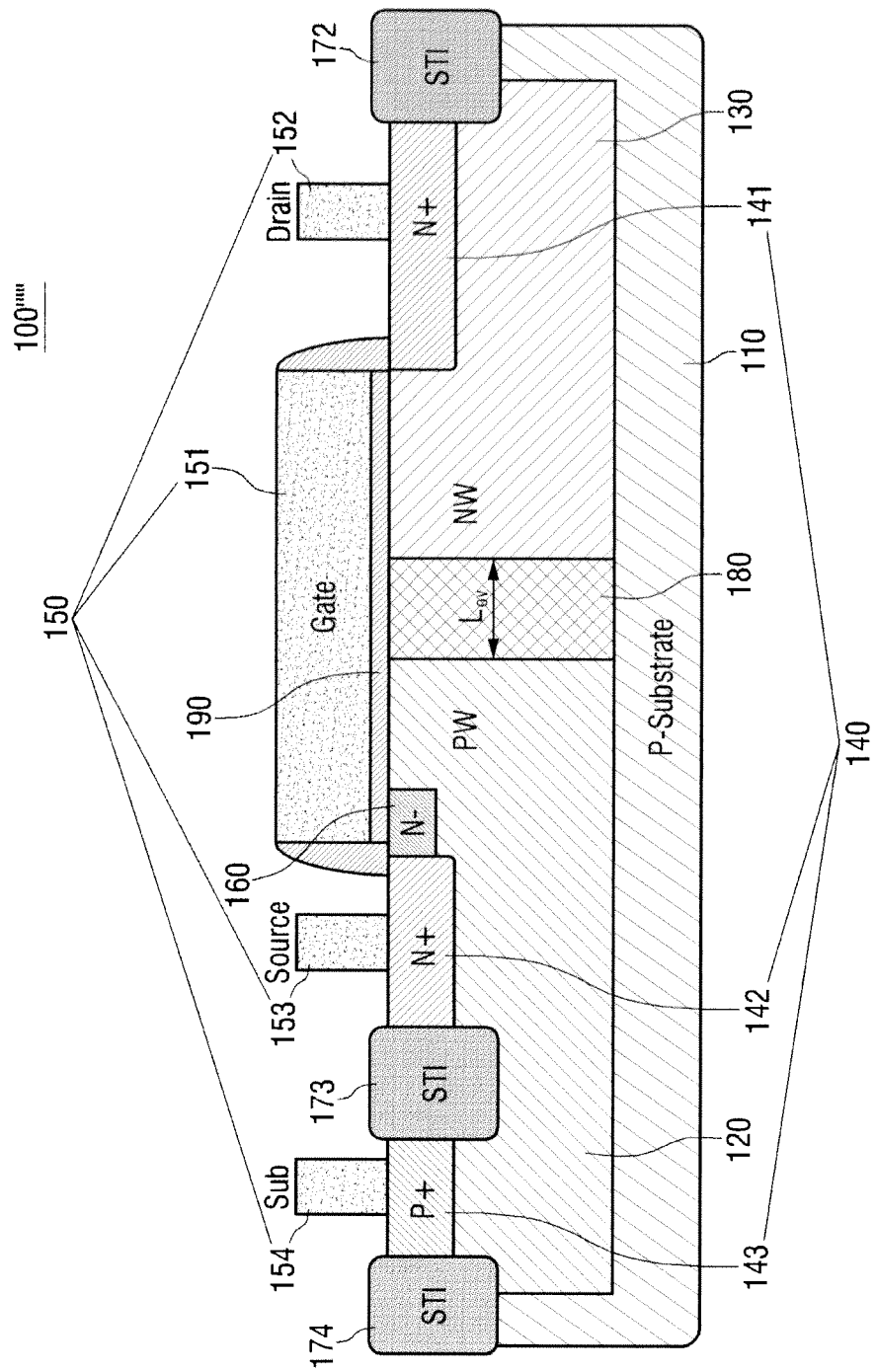

FIG. 6 is a cross-sectional view illustrating the structure of a semiconductor device according to a sixth exemplary embodiment.

Referring to FIG. 6, the semiconductor device 100''''' comprises the substrate 110, the first well region 120, the second well region 130, the doped region 140, the electrode 150, the LDD region 160, the overlapping region 180, and the gate insulating layer 190. Herein, the semiconductor device 100''''' is an EDMOS device.

The semiconductor device 100''''' in the sixth exemplary embodiment is distinct from the se conductor device 100 in the first exemplary embodiment in that it does not have the separating unit 171. Since the explanations regarding the substrate 110, the first well region 120, the second well region 130, the doped region 140, the electrode 150, the LDD region 160, the overlapping region 180, and the gate insulating layer 190 except for the separating unit 171 have already been provided above, detailed description regarding them will no longer be provided.

As such, the semiconductor device 100''''' in the sixth exemplary embodiment includes the overlapping region 180 having a low doping level by overlapping the first well region and the second well region, and thus the electrical characteristics of EDMOS (device performance, leakage current, breakdown voltages, specific on-resistance) may be enhanced. In addition, as the LDD region 160 which is formed next to the source region is included, current drivability may be enhanced.

FIGS. 7A to 7H are cross-sectional views provided to explain a method for manufacturing a semiconductor device according to the exemplary embodiment.

Figure 7A:
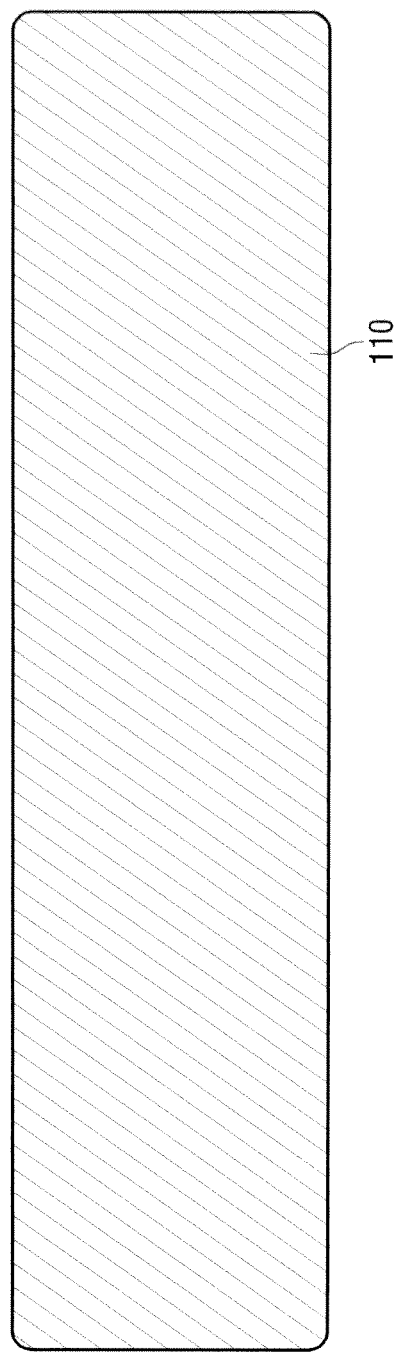
FIGS. 7A to 7H are views provided to explain a method for manufacturing the semiconductor device according to the first exemplary embodiment.

First of all, referring to FIG. 7A, the substrate 110 is provided. The substrate 110 may be an ordinary silicon substrate or a P-substrate in which P-type impurity is doped.

Figure 7B:
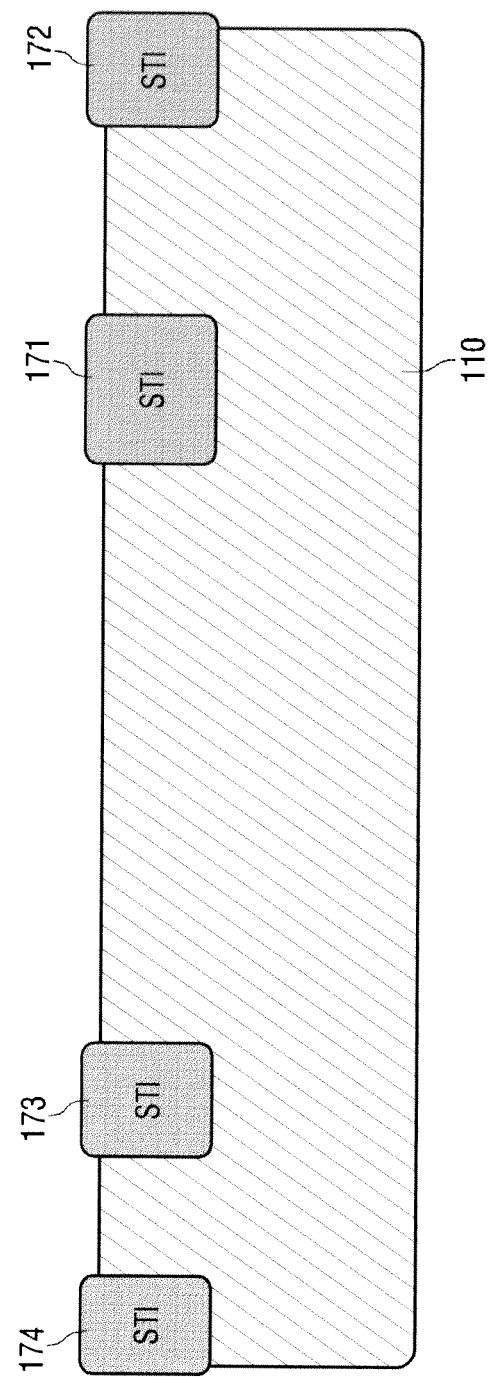

As a next step, the separating unit 171 may be formed as illustrated in FIG. 7B. Specifically, STI having lower depth than the second well region may be formed in the vicinity of the drain region will be formed. A semiconductor device may be manufactured in a way illustrated in the third, fourth, and sixth exemplary embodiments as other separating units 172, 173, 174 except for the separating unit 171 may be formed.

Figure 7C:
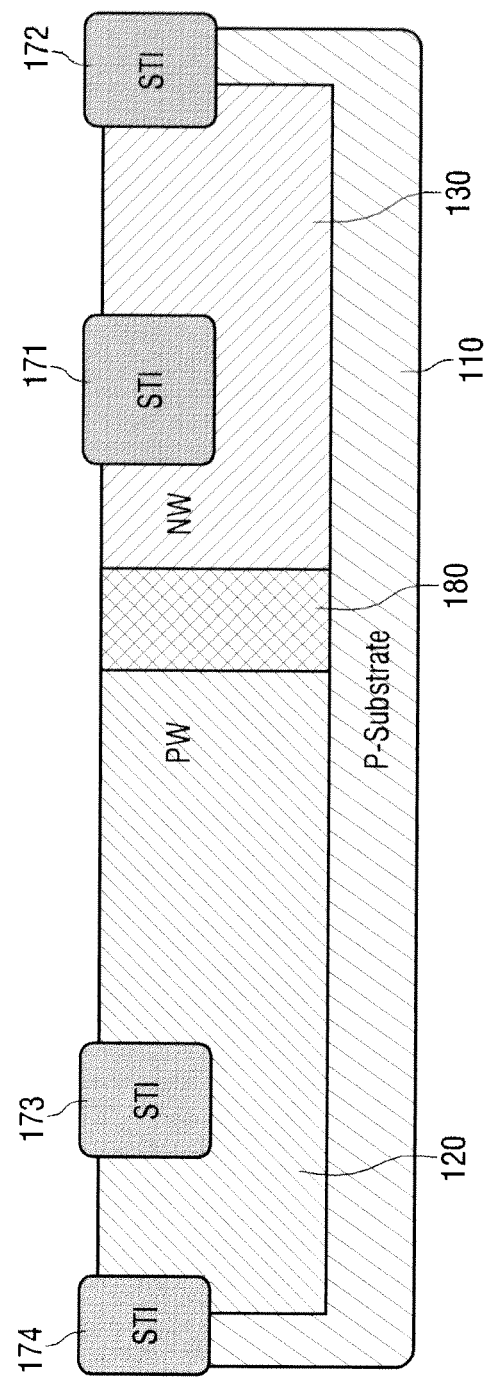

As illustrated in FIG. 7C, two different types of regions, that is, the first well region 120 and the second well region 130, and the overlapping region 180 where the first well region is overlapped over the second well region may be formed. Specifically, the process of ion-implantation using low energy gradually may be performed several times for each well region, and thus the first well region 120 and the second well region 130 may be formed.

More specifically, the process of forming the first well region may be performed through three-stage ion-implantation. For example, in the first stage, boron may be ion-implanted under the condition of 120 KeV to 200 KeV and 1E12 to 1E14, in the second stage, boron may be ion-implanted under the condition of 5 KeV to 45 KeV and 1E11 to 1E13, and in the third stage, indium may be ion-implanted under the condition of 150 KeV to 190 KeV and 1E11 to 1E13.

The process of forming the second well region may also be performed through three-stage ion-implantation. Specifically, in the first stage, phosphorous may be ion-implanted under the condition of 400 KeV to 500 KeV and 1E12 to 1E14, in the second stage, phosphorous may be ion-implanted under the condition of 120 KeV to 160 KeV and 1E11 to 1E13, and in the third stage, arsenic may be ion-implanted under the condition of 110 to 150 KeV and 1E11 to 1E13.

The overlapping region 180 may be formed by overlapping the location of a mask used to form the first well region and the location of a mask used to form the second well region. Reversely, a semiconductor device may be formed in a way illustrated in the second and the third exemplary embodiments if the first well region is not overlapped with the second well region in the process of forming the first well region and the second well region. After the process of ion-implantation for forming a well region, the process of annealing may be performed to activate or diffuse the implanted ions. Specifically, in order to activate or diffuse the ion-implanted dopants, annealing may be performed under the condition of 900 to 1100 for 1 to 20 seconds.

In the exemplary embodiment, the well regions 120, 130, 180 are formed after the separating unit 171 is formed, but the separating unit 171 may be formed after the well regions are formed.

Figure 7D:
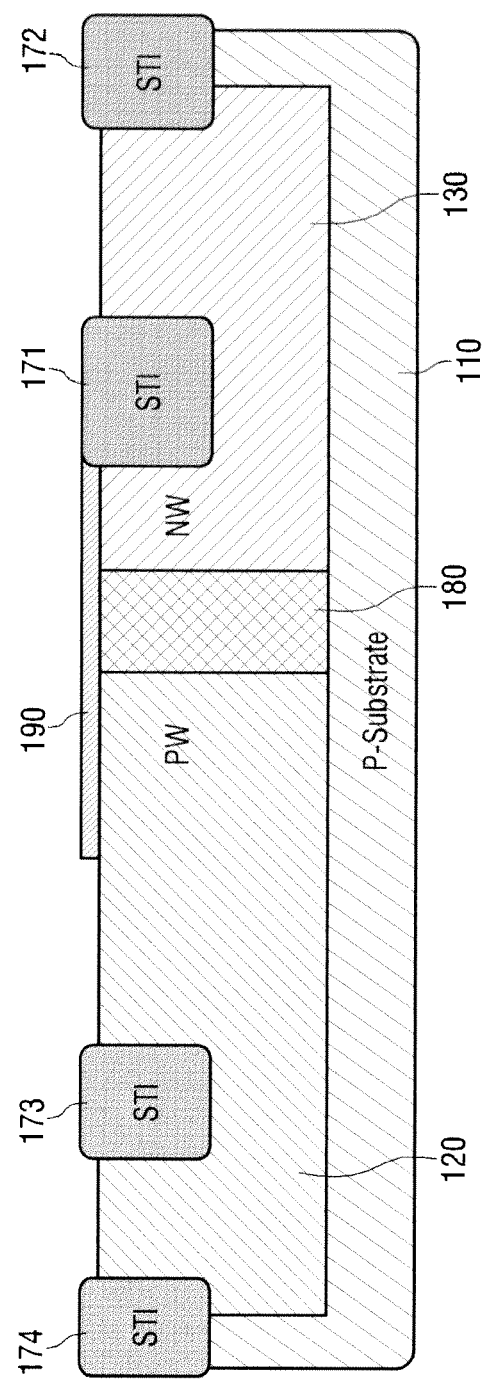

Subsequently, the gate insulating layer 190 is formed as illustrated in FIG. 7D. Specifically, a gate insulating layer which extends over the surface of the overlapping region 180 to the first well region 120 and the second well region 130. Herein, the gate insulating layer may be an oxide layer or a nitride layer having the thickness 125 Å.

Figure 7E:
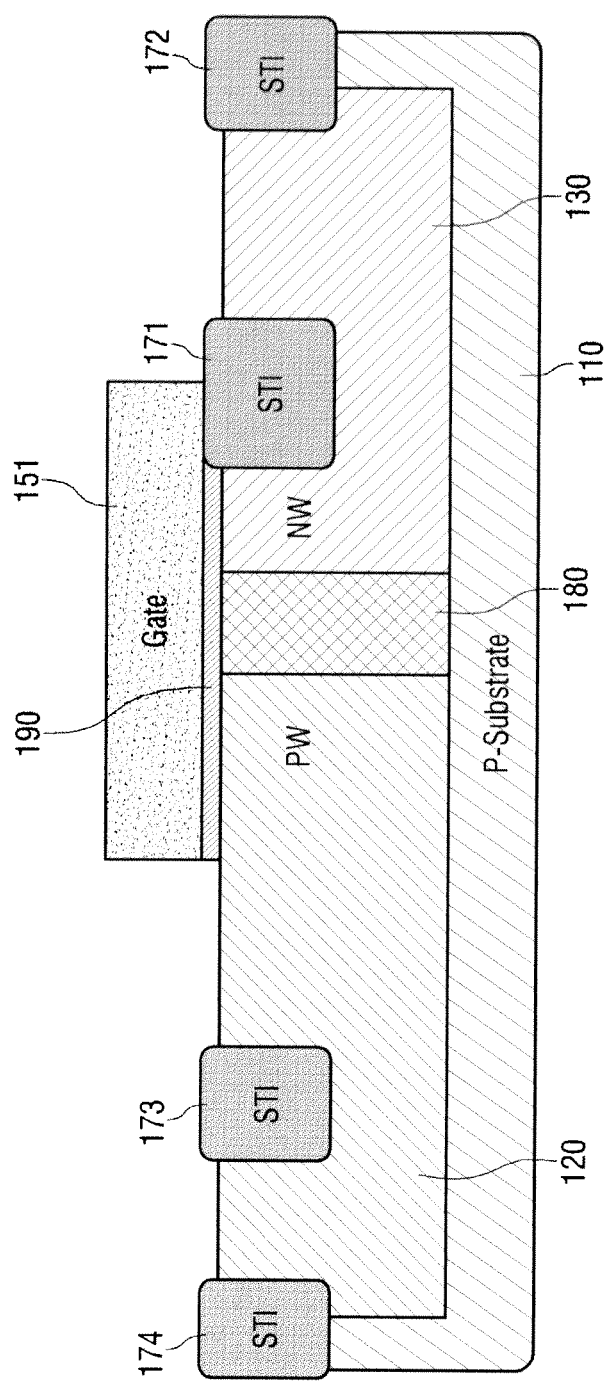

Subsequently, the gate electrode 151 may be formed on an upper portion of the gate insulating layer as illustrated in FIG. 7E.

Figure 7F:
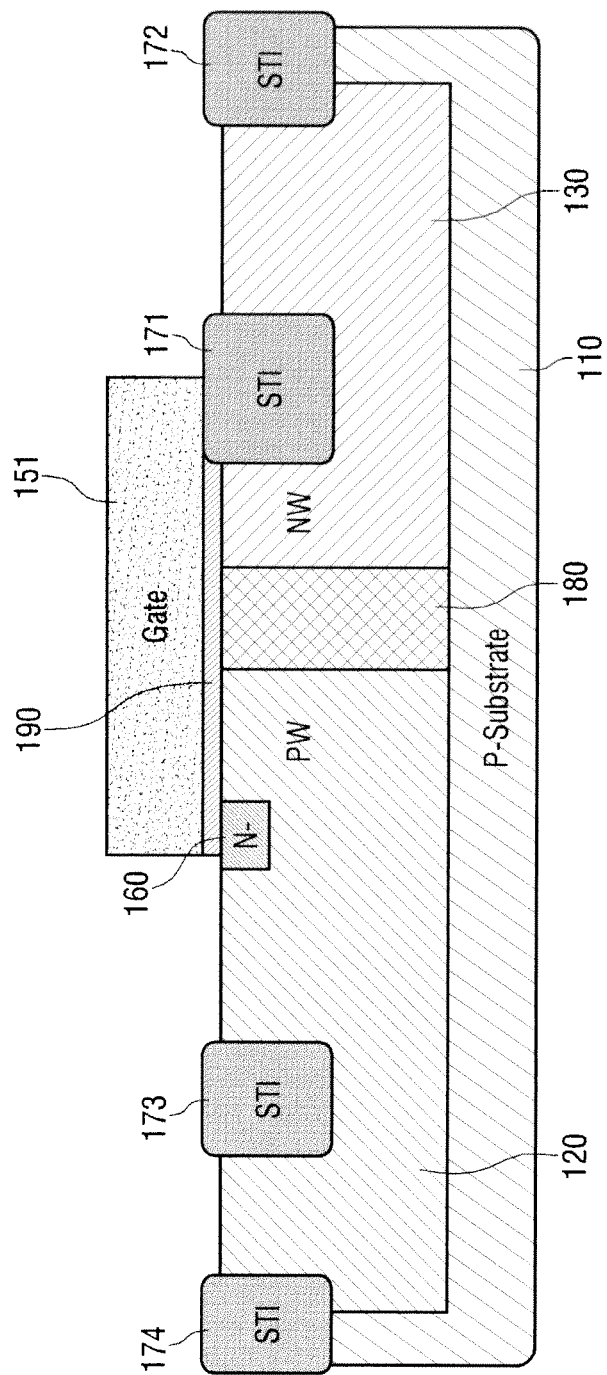

Afterwards, the LDD region 160 may be formed as illustrated in FIG. 7F. Specifically, the process of ion-implantation may be performed in the first region 120 to form an N-region on a lower portion of the gate electrode 151. Herein, the LDD region 160 is formed by ion-implanting the same doping type as the source region on a lower portion of the gate electrode 151 in the first well region 120. After the process of ion-implantation for forming the LDD region, annealing may be performed to activate and diffuse the implanted ions.

However, a semiconductor device may be manufactured without going through the above process as in the fourth or fifth exemplary embodiment.

Figure 7G:
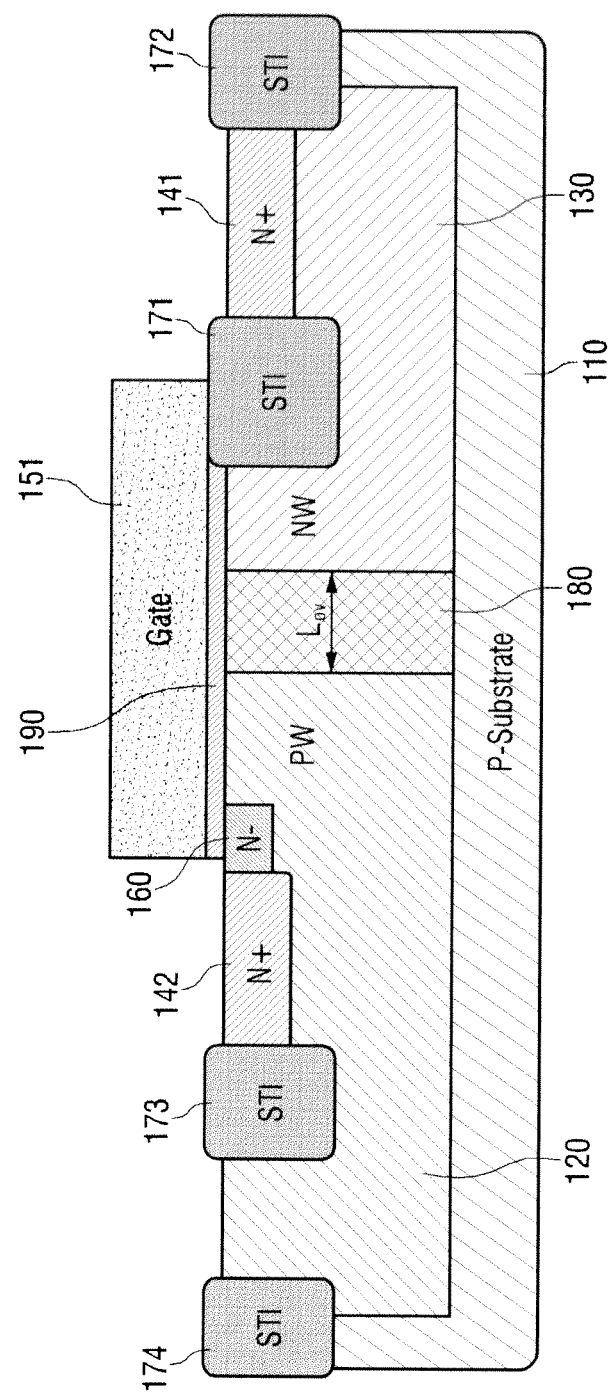
Figure 7H:
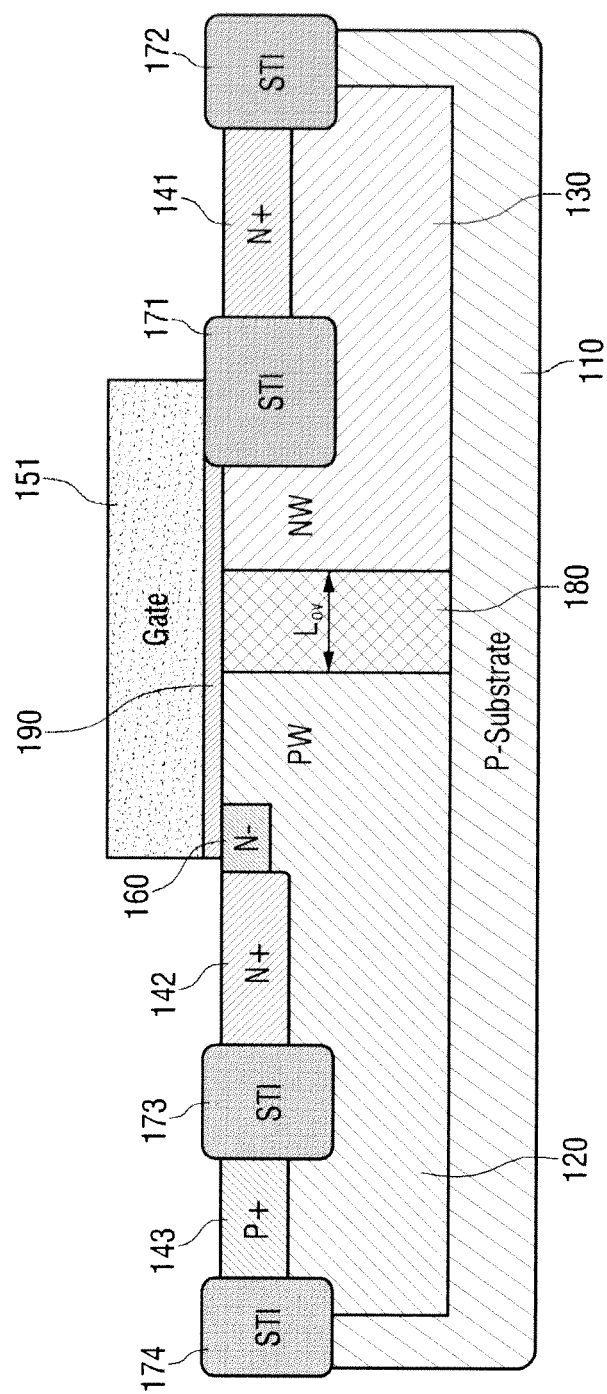

As illustrated in FIG. 7G and FIG. 7H, ion-implantation may be performed to form the drain region 141 the source region 142, and the substrate region 143. After ion-implantation is performed to form the drain region 141, the source region 142, and the substrate region 143, annealing may be performed to activate or diffuse implanted ions.

Subsequently, electrode formation and space etching are performed as a follow-up process for forming EDMOS, so that a semiconductor device may be formed as illustrated in FIG. 1 to FIG. 6.

Figure 8A:
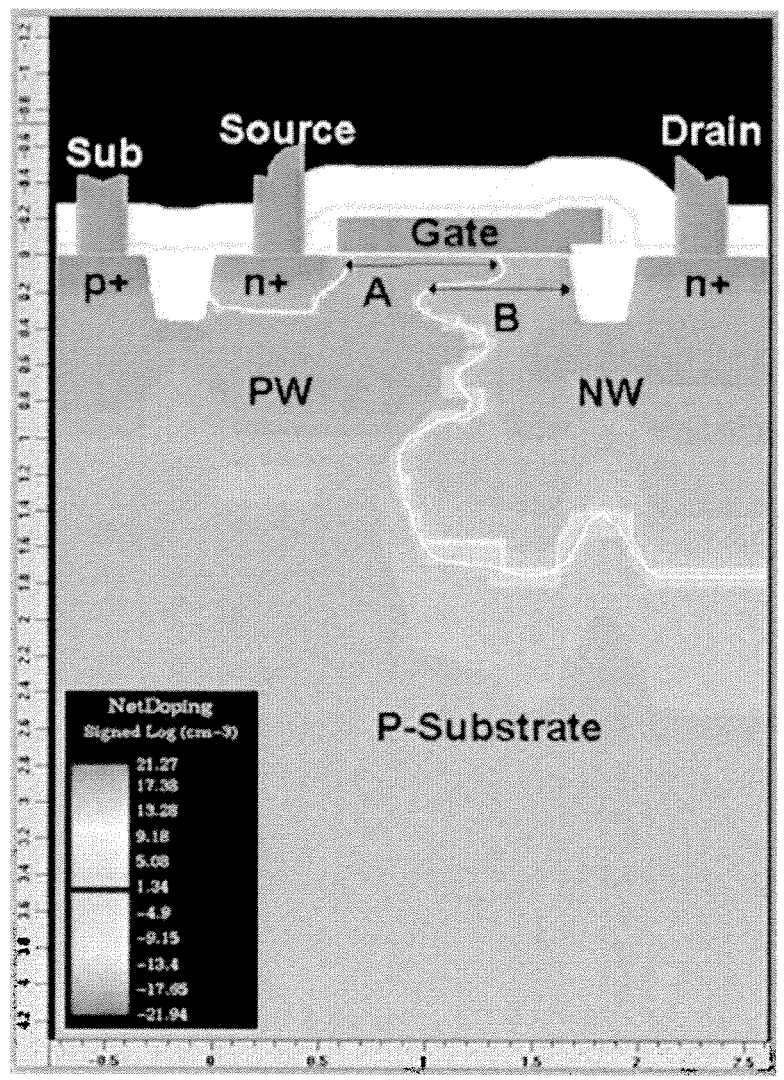
FIGS. 8A, 8B, and 9 are views illustrating the doping concentration of the semiconductor device according to selected ones of the exemplary embodiments.
Figure 8B:
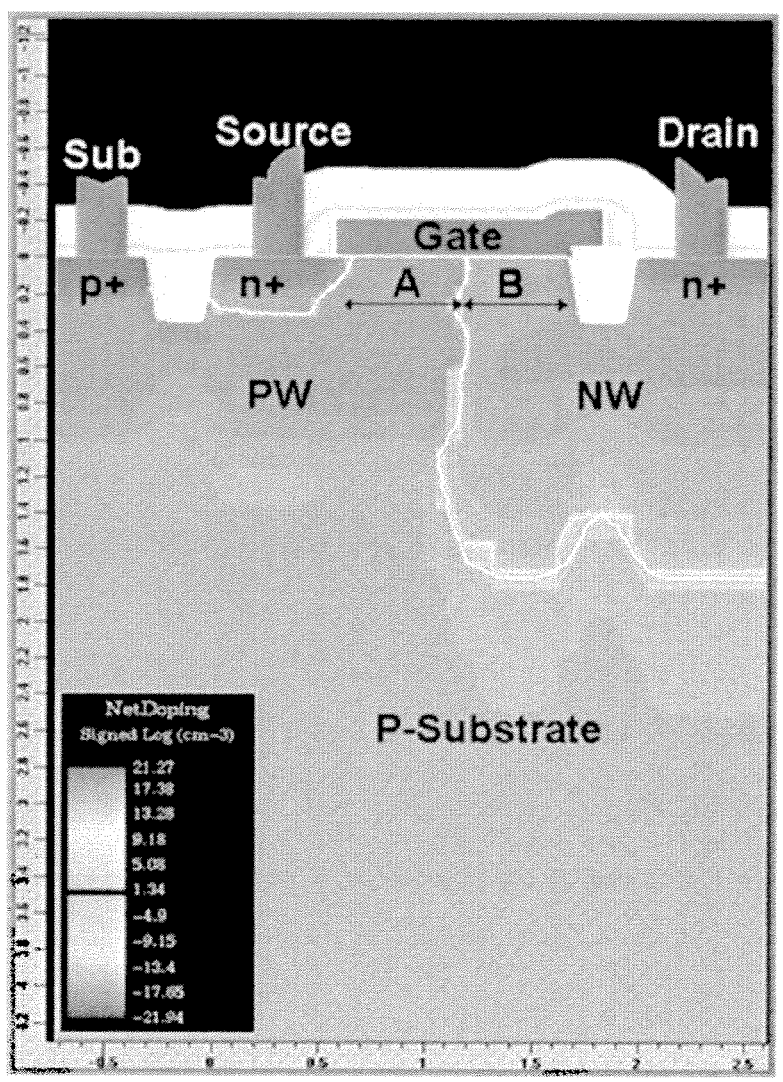

FIGS. 8A and 8B are views illustrating the doping profiles in the semiconductor device according to the exemplary embodiment. Specifically, FIG. 8A illustrates the doping profile of a semiconductor device according to the first exemplary embodiment. Referring to FIG. 8A, the boundaries between the first well region (PW) and the second well region (NW) are bent significantly. That is, it can be seen that the overlapping region 180 has doping concentration which varies vertically. As the first well region (PW) and the second well region (NW) overlaps each other, the portion occupied by each region varies according to doping density.

For example, the first well region (PW) expands into the second well region (NW) in the channel which is right below the oxide layer 190 since the concentration of the first well region (PW) on the surface of the substrate is much greater than that of the second well region (NW). On the contrary, the second well region (NW) expands into the first well region (PW) little bit below the surface of the substrate. Accordingly, different profiles may be obtained according to the differences in concentration in local regions between the first well region (PW) and the second well region (NW).

FIG. 8B illustrates the doping profile of the semiconductor device according to the second exemplary embodiment. Referring to FIG. 8B, the boundaries between the first well region (PW) and the second well region (NW) form almost a vertical straight line.

Referring to FIGS. 8A and 8B, the profile on the lower portion of a separating unit 171 (e.g. STI) is caved in more than on the lower portion. This is because ion-implantation is performed on the well region after the separating unit 171 (e.g. STI) is formed. That is, since the separating unit 171 (e.g. STI) serves as a mask, the depth becomes thin as dopant is injected thinly.

FIG. 9 is a view illustrating net doping concentration of a semiconductor device according to an exemplary embodiment. Specifically, the dotted line in FIG. 9 indicates the net doping concentration of region A to region B in FIG. 1, and the solid line in FIG. 9 indicates the net doping concentration of region A to region B in FIG. 2.

Referring to FIG. 9, the net doping concentration of the overlapping region according to the first exemplary embodiment (dotted line) is lower than that of the first well region (PW) and the second well region (NW) due to dopant compensation. The overlapping region having low doping level alleviates the effect of well junction electric field and changes electric characteristics of EDMOS. Specifically, referring to the dotted line in FIG. 9, the net doping concentration of the first well region (PW) in the overlapping region decreases gradually. That is, if a graded p-n junction is formed by the overlapping region, the effect of electric field becomes weak. As a result, breakdown voltage may increase, and on-resistance may decrease.

On the other hand, referring to the solid line in FIG. 9, the profile of the first well region (PW) falls dramatically, and thus an abrupt p-n junction is formed in a very narrow section.

FIGS. 10A to 12B are views illustrating experimental values and simulation results regarding electrical characteristics of the semiconductor devices according to the first exemplary embodiment and the second exemplary embodiment.

Figure 10A:
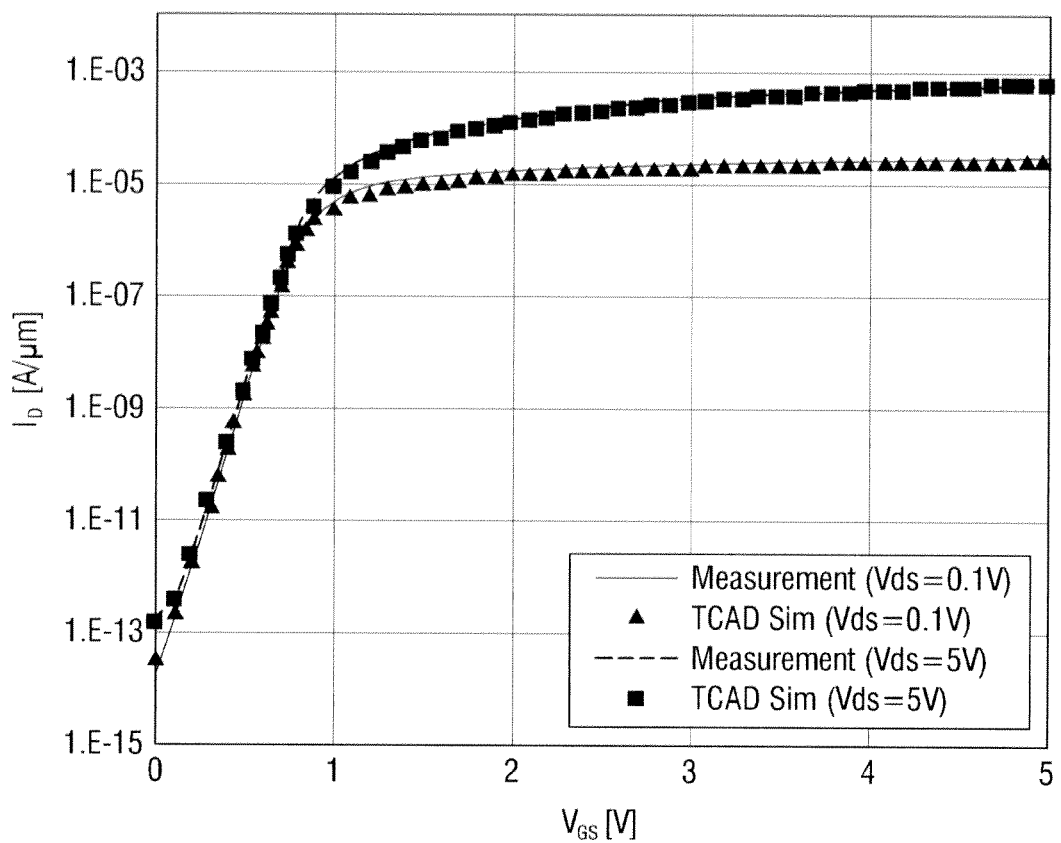
FIGS. 10A, 11A, and 12A are views illustrating experimental values and simulation results regarding electrical characteristics of the semiconductor device according to the first exemplary embodiment in FIG. 1, and FIGS. 10B, 11B, and 12B are views illustrating experimental values and simulation results regarding electrical characteristics of the semiconductor device according to the second exemplary embodiment in FIG. 2.
Figure 10B:
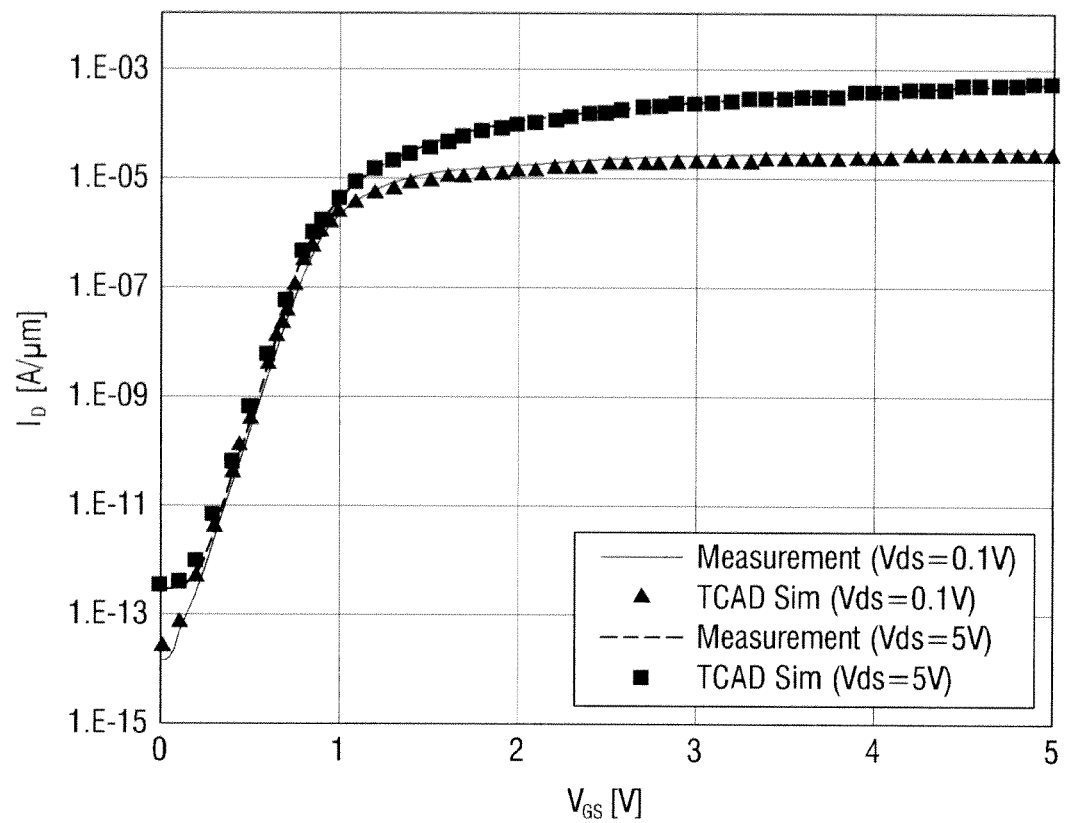

Specifically, FIG. 10A is a view illustrating experimental values and simulation results regarding the sub-threshold characteristics of the semiconductor device according to the first exemplary embodiment, and FIG. 10B is a view illustrating experimental values and simulation results regarding the sub-threshold characteristics of a semiconductor device according to the second exemplary embodiment. Referring to FIGS. 10A and 10B, the sub-threshold characteristics of the semiconductor devices according to the exemplary embodiments are consistent with the simulation results. In addition, the leakage current of the semiconductor device according to the first exemplary embodiment is smaller than the leakage current of the semiconductor device according to the second exemplary embodiment.

Figure 11A:
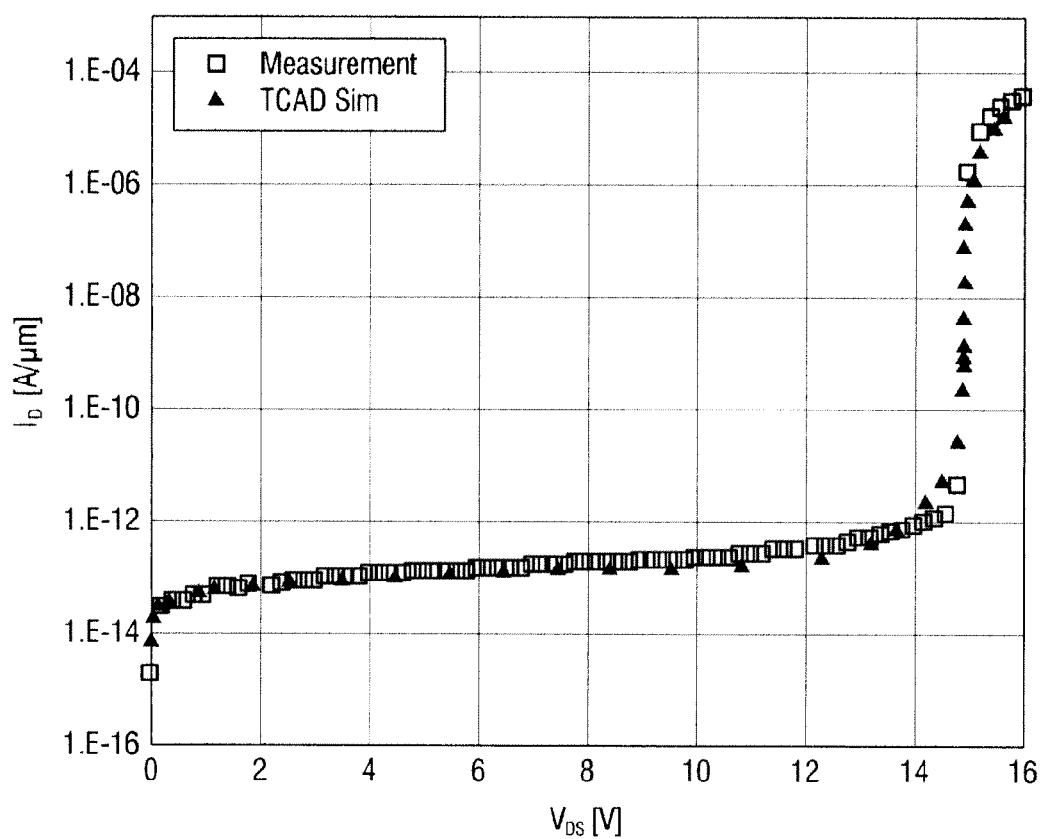
Figure 11B:
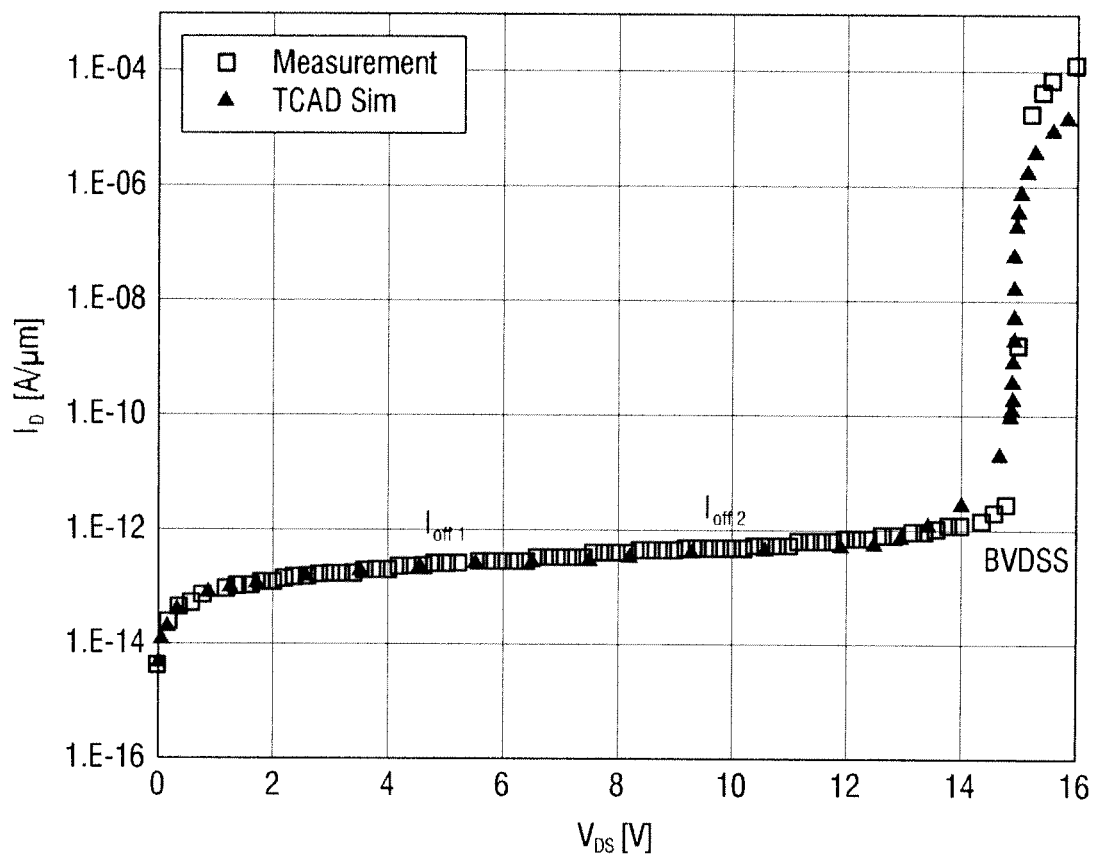

FIG. 11A is a view illustrating experimental values and simulation results regarding $I_D$-$V_{DS}$ characteristics when $V_{gs}$=0V according to the first exemplary embodiment, and FIG. 11B is a view illustrating experimental values and simulation results regarding $I_D$-$V_{DS}$ characteristics when $V_{gs}$=0V according to the second exemplary embodiment.

Figure 12A:
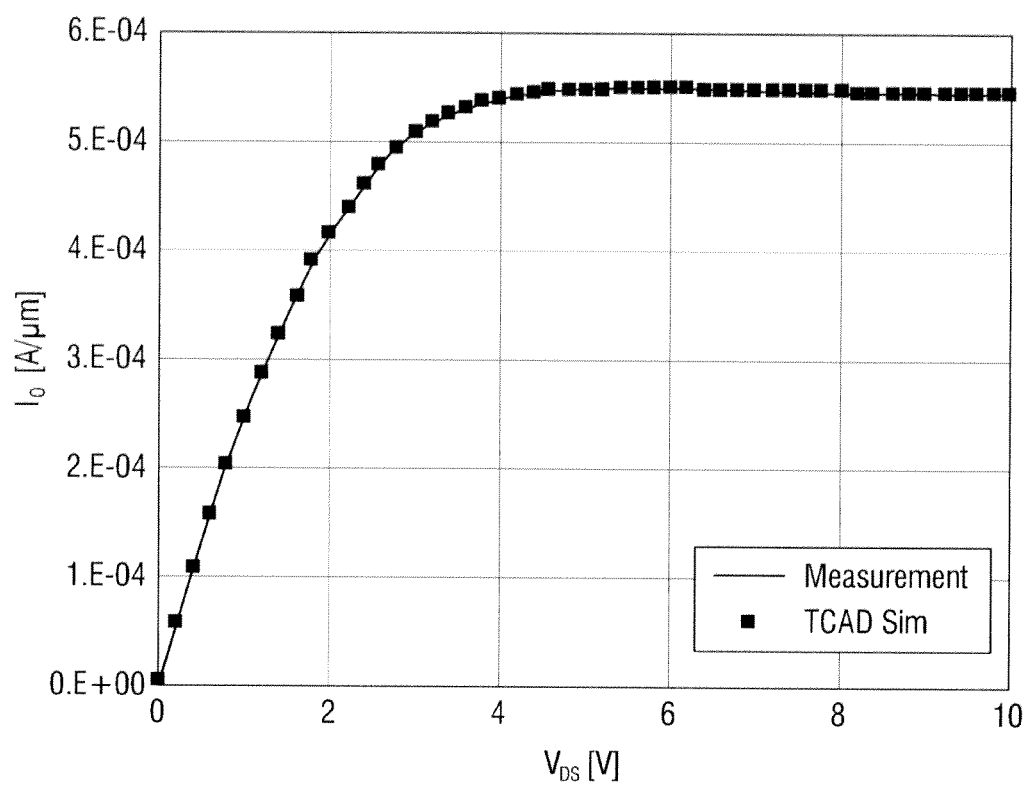
Figure 12B:
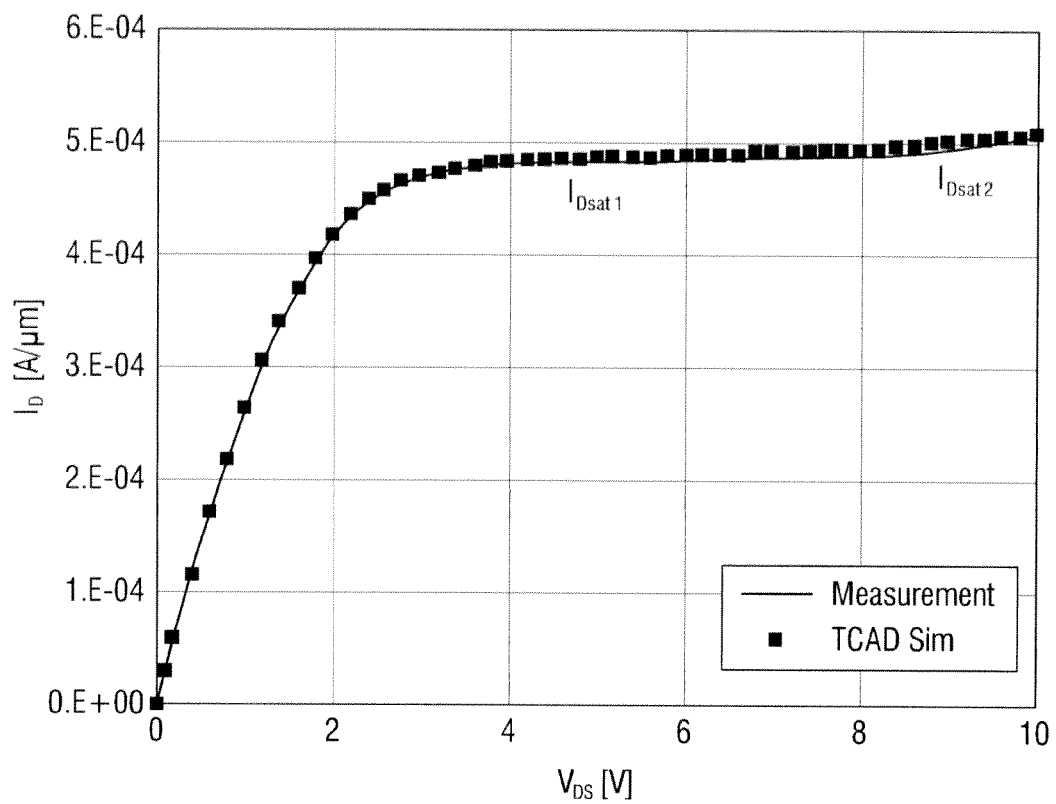

FIG. 12A is a view illustrating experimental values and simulation results regarding $I_D$-$V_{DS}$ characteristics at $V_{gs}$=5V according to the first exemplary embodiment, and FIG. 11B is a view illustrating experimental values and simulation results regarding $I_D$-$V_{DS}$ characteristics at $V_{gs}$=5V according to the second exemplary embodiment. The breakdown voltage (BVDSN) of the semiconductor device according to the first exemplary embodiment is higher than the breakdown voltage (BVDSN) of the semiconductor device according to the second exemplary embodiment (see FIG. 15).

Referring to FIGS. 11A to 12B, the measured $I_D$-$V_{DS}$ characteristics of the semiconductor devices according to the exemplary embodiments are consistent with the simulation results. In addition, referring to FIGS. 10A to 12B, the semiconductor devices according to the exemplary embodiments operate normally as transistors.

Figure 13A:
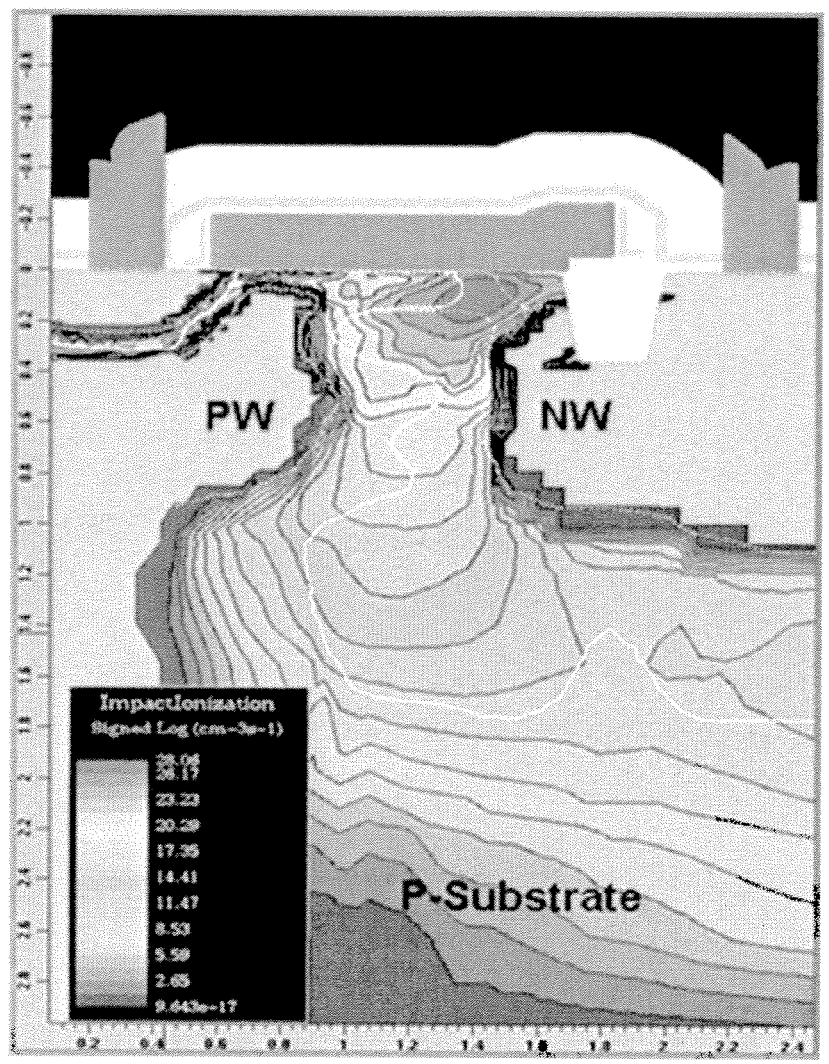
FIGS. 13A and 13B are views illustrating impact ionization rate distribution of the semiconductor devices of the first and the second exemplary embodiments at $V_{GS}$=5 V, $V_{DS}$=10 V, respectively.
Figure 13B:
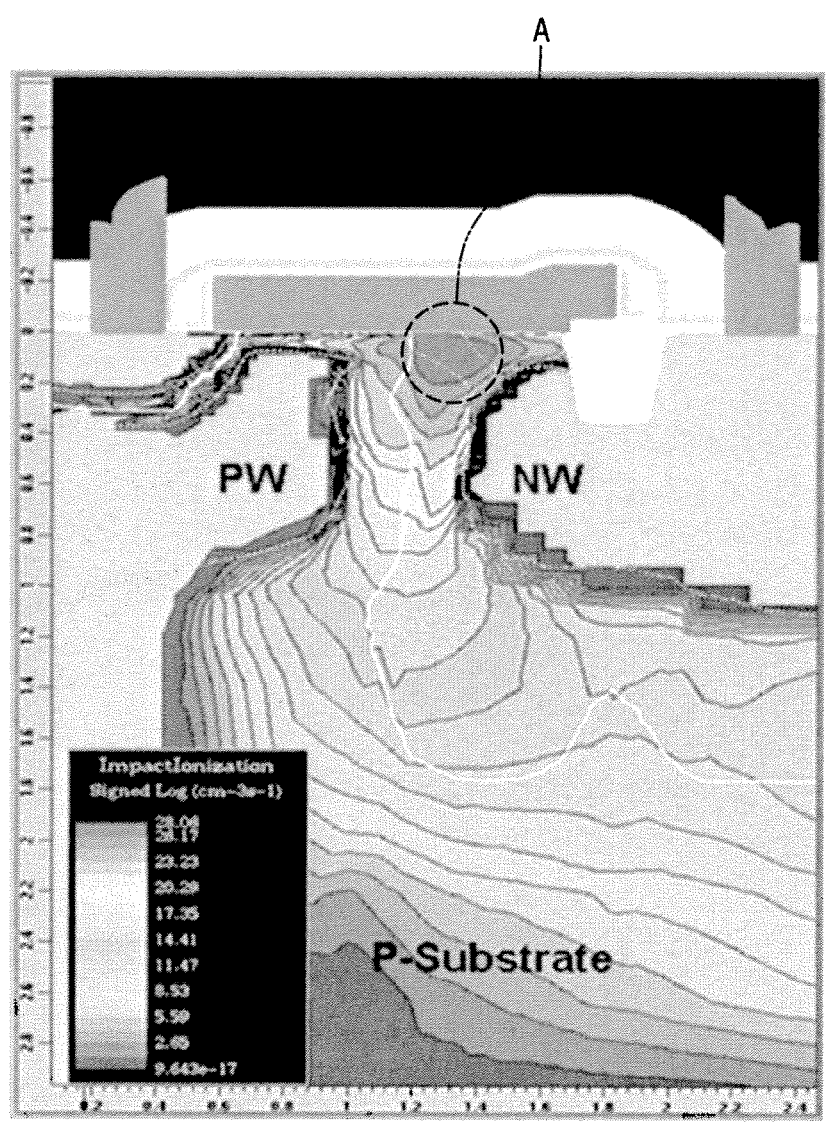
Figure 14A:
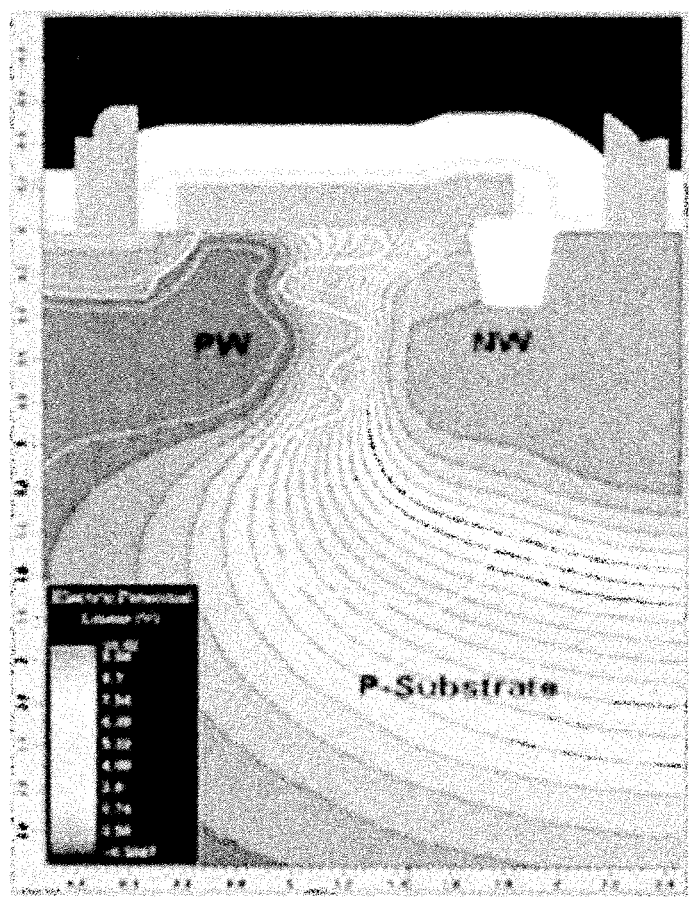
FIGS. 14A and 14B are views illustrating equipotential contour distribution of the semiconductor device of the first and the second exemplary embodiments at $V_{GS}$=5 V, $V_{DS}$=10 V, respectively.
Figure 14B:
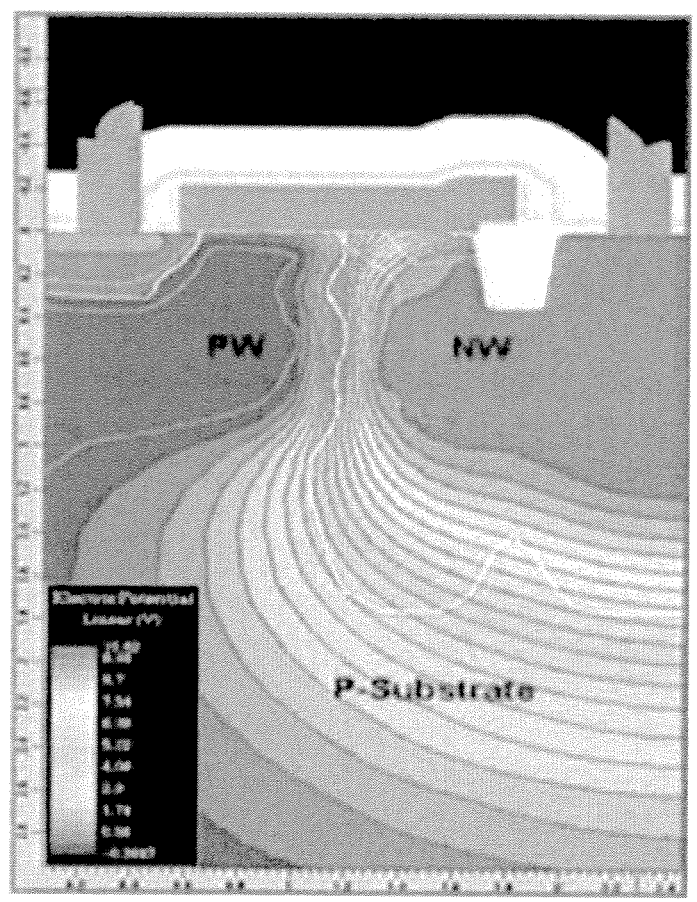

FIGS. 13A and 13B is a view illustrating impact ionization rate distribution of the semiconductor devices according to the first exemplary embodiment and the second exemplary embodiment when $V_{GS}$=5 V, $V_{DS}$=10 V, respectively. FIGS. 14A and 14B are views illustrating equipotential contours of the semiconductor devices according to the first exemplary embodiment and the second exemplary embodiment when $V_{GS}$=5 V, $V_{DS}$=10 V, respectively.

Referring to FIG. 13B, an impact ionization rate is high in region A between the second well region (NW) and the first well region (PW).

Referring to FIGS. 13A and 13B, the region with high impact ionization rate according to the first exemplary embodiment (see FIG. 13A) is narrower than the region with high impact ionization rate according to the second exemplary embodiment (see FIG. 13B) and is away from the silicon surface. The semiconductor device according to the first exemplary embodiment has relatively low electron-hole pairs (EHP) generated by impact ionization in comparison with the semiconductor device according to the second exemplary embodiment.

Referring to FIGS. 13A and 14B, the current gain of a NPN parasitic bipolar transistor according to the first exemplary embodiment is smaller than current gain of a NPN parasitic bipolar transistor according to the second exemplary embodiment, so the breakdown voltage (BVDSN) of the first exemplary embodiment is higher (see FIG. 15). In addition, the distance between potential contour lines near the substrate surface in the first exemplary embodiment is wider than the distance between potential contour lines in the second exemplary embodiment, and thus the effect of electric field is weaker.

FIG. 15 is a table comparing electrical characteristics of the semiconductor device (nEDMOS #2) according to the first exemplary embodiment with electrical characteristics of the semiconductor device (nEDMOS #1) according to the second exemplary embodiment.

Referring to FIG. 15, the semiconductor device (nEDMOS #2) according to the first exemplary embodiment has advantages in that it has high performance (Idsat), low power (Ioff), safe operating region (BVDSN) compared to the semiconductor device (nEDMOS #1) according to the second exemplary embodiment. Specifically, BVDSN (breakdown voltage at $V_{GS}$=5V), IDsat (drain saturation current at $V_{GS}$=5V) of a semiconductor device (nEDMOS #2) according to the first exemplary embodiment are higher than those of a semiconductor device (nEDMOS #1) according to the second exemplary embodiment by 22% and 13.4% respectively, and Ioff (off-current at $V_{GS}$=0V, $V_{DS}$=10V) of the semiconductor device (nEDMOS #2) according to the first exemplary embodiment is lower than that of the semiconductor device (nEDMOS #1) according to the second exemplary embodiment by 53%.

FIGS. 16A to 17B are views illustrating changes in BVDSS, Rsp, Idsat of the semiconductor device (nEDMOS #2) according to the first exemplary embodiment and the semiconductor device (nEDMOS #1) according to the second exemplary embodiment due to increase in the length of the first well region 120.

Figure 16A:
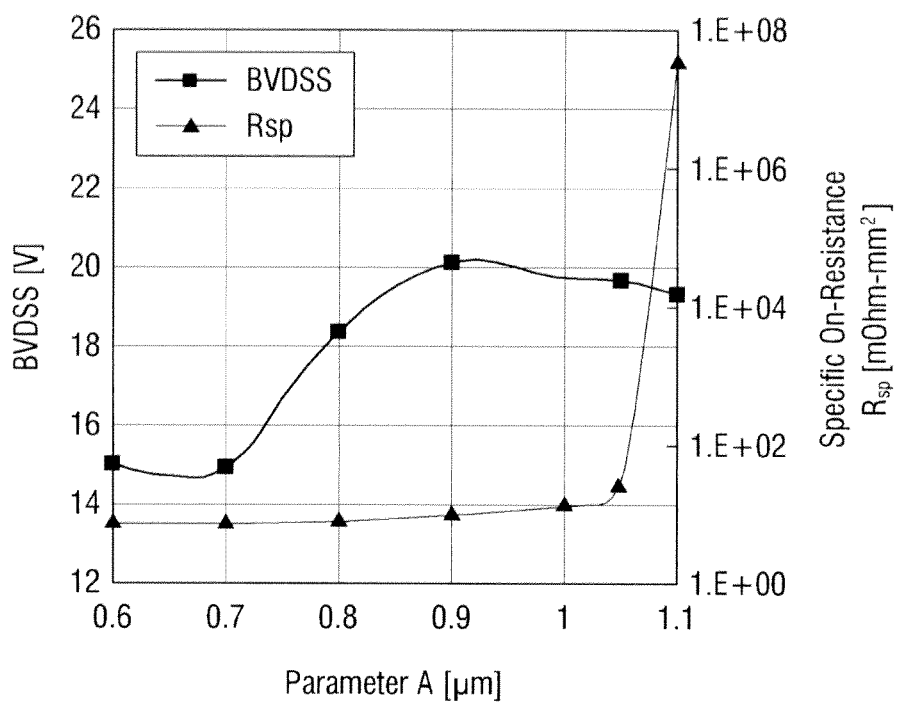
FIGS. 16A and 17A are views illustrating dependence of BVDSS, Rsp, Idsat of a semiconductor device (nEDMOS #2) on the parameter A of the first well region 120 for $L_G$=1.25, B=0.7 of the first exemplary embodiment.

Referring to FIG. 16A, the BVDSS and Rsp of the semiconductor device (nEDMOS #1) according to the second exemplary embodiment increase as the first well region (PW) increases. The trade-off between BVDSS and Rsp is so big. The maximum BVDSS is limited to 20 V. As the first well region increases, Rsp becomes so high that performance of the device degrades dramatically.

Figure 16B:
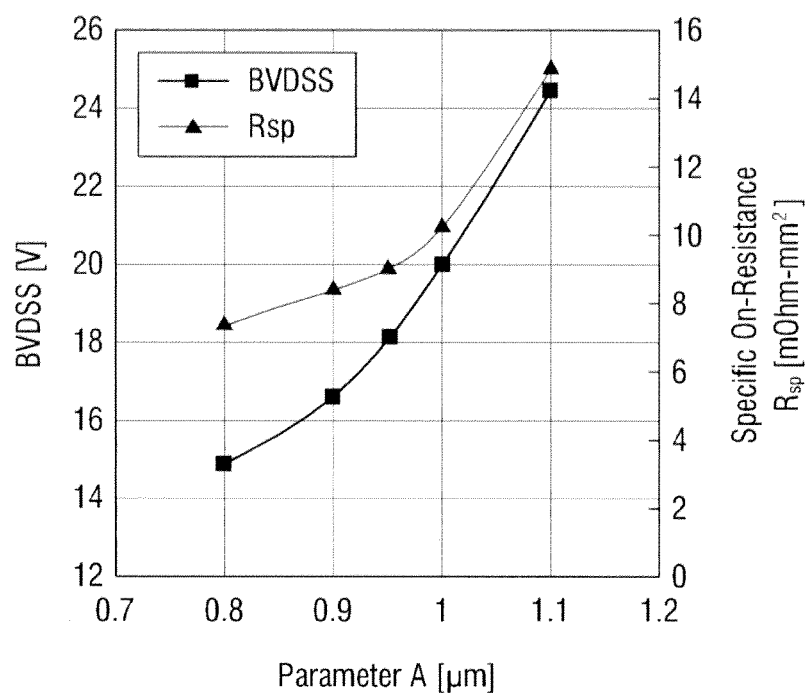
FIGS. 16B and 17B are views illustrating dependence of BVDSS, Rsp, Idsat of a semiconductor device (nEDMOS #1) on the parameter A of the first well region 120 for $L_G$=1.25, B=1.1−A of the second exemplary embodiment.

Referring to FIG. 16B, however, as the first well region (PW) of the semiconductor device (nEDMOS #2) according to the first exemplary embodiment is increased, BVDSS increases over 24V and Rsp increases remarkably smaller than the semiconductor device (nEDMOS #1) according to the second exemplary embodiment. Thus, the nEDMOS #2 with the overlapping region has much better trade-off between BVDSS and Rsp than the nEDMOS #1 without the overlapping region.

Figure 17A:
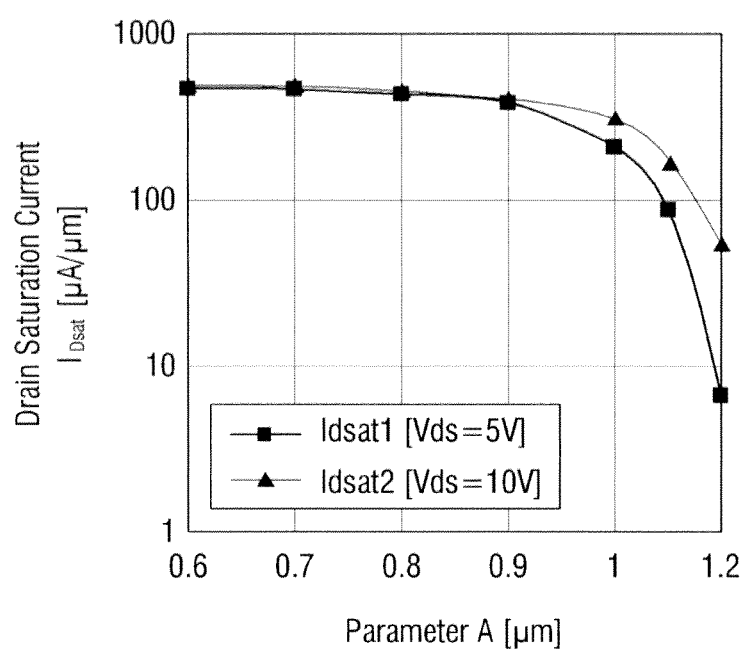
Figure 17B:
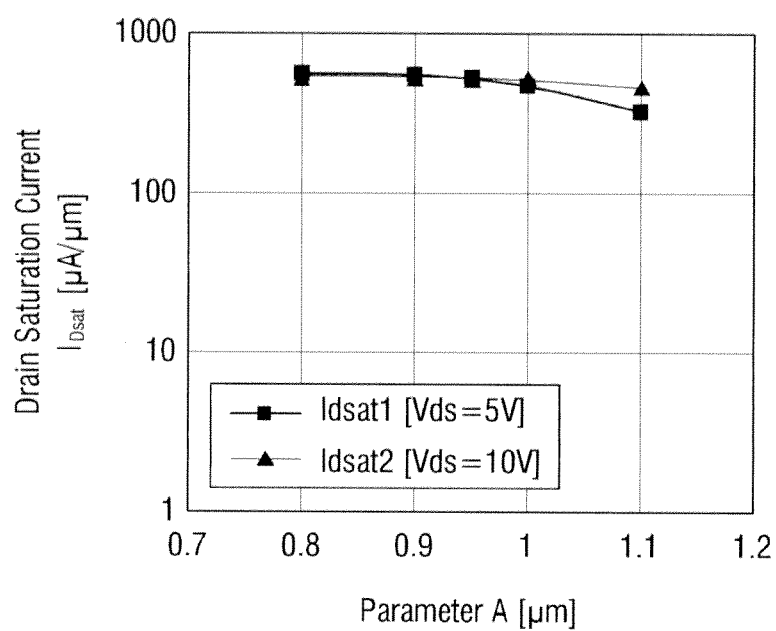

Referring to FIG. 17B, the drain saturation current value of a semiconductor device (nEDMOS #2) according to the first exemplary embodiment does not decrease significantly even though the length of the first well region (PW) increases. On the other hand, referring to FIG. 17A, the drain saturation current value of a semiconductor device (nEDMOS #1) according to the second exemplary embodiment drops dramatically if the length of the first well region (PW) increases.

Referring to FIGS. 16B and 17B, the figure-of-merit (Rsp/BVDSS) and the current drivability of the semiconductor device (nEDMOS #2) according to the first exemplary embodiment are much better than than the semiconductor device (nEDMOS #1) according to the second exemplary embodiment as the first well region (PW) is increased. The specific on-resistance of the semiconductor device (nEDMOS #2) according to the first exemplary embodiment is small enough to be comparable with the smallest one in documents published in the related art.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A semiconductor device, comprising:
    a substrate;
    a first well region formed by being doped in a first location on a surface of the substrate;
    a second well region formed by being doped in a different type from the first well region in a second location on a surface of the substrate;
    an overlapping region between the first well region and the second well region where the first well region and the second well region substantially coexist;
    a gate insulating layer formed on a surface of the first and the second well regions and on a surface of the overlapping region;
    a gate electrode formed on the insulating layer;
    a source region formed on an upper portion of the first well region; and
    a drain region formed on an upper portion of the second well region,
    wherein a net doping concentration in the overlapping region gradually decreases from a boundary between the first well region and the overlapping region to a boundary between the second well region and the overlapping region, and a ratio of a length of the gate electrode to a length of the first well region overlapping the gate electrode ranges between 80% and 96%.

2. The semiconductor device as claimed in claim 1, wherein the overlapping region has width of 0.2 μm to 0.7 μm.

3. The semiconductor device as claimed in claim 1, wherein the overlapping region has a lower net doping concentration than the first well region and the second well region.

4. The semiconductor device as claimed in claim 1, wherein the overlapping region has doping concentrating which varies in a vertical direction of the substrate and has a well concentration profile which is bent according to differences in doping concentration in a horizontal direction of the substrate.

5. The semiconductor device as claimed in claim 1, further comprising:
    an LDD region, which is just adjacent to the source region, formed by being doped in a same type as the source region,
    wherein the LDD region has lower doping concentration than the source region,
    wherein at least part of the LDD region is located beneath the gate electrode.

6. The semiconductor device as claimed in claim 1, further comprising:
    a separating unit formed next to the drain region.

7. The semiconductor device as claimed in claim 6, wherein the separating unit is a shallow trench isolation (STI) region having lower depth than the second well region.

8. A method for manufacturing a semiconductor device, comprising:
    forming a first well region and a second well region which are doped with different type dopants, and an overlapping region where the first well region and the second well region overlap each other by performing dopant ion implantation on a surface of a substrate;
    forming a gate insulating layer extending over a surface of the overlapping region, the first well region and the second well region;
    forming a gate electrode on the insulating layer; and forming a source region and a drain region by performing ion implantation,
wherein a net doping concentration in the overlapping region has gradually decreases from a boundary between the first well region and the overlapping region to a boundary between the second well region and the overlapping region, and a ratio of a length of the gate electrode to a length of the first well region overlapping the gate electrode ranges between 80% and 96%.

9. The method as claimed in claim 8, wherein the first and second well regions are formed by performing dopant ion implantation multiple times, using high and low energy.

10. The method as claimed in claim 8, wherein the overlapping region has a width of 0.2 μm to 0.7 μm to design an nEDMOS with the gate length of LG=1.25 μm, wherein the length of the overlapping region depends on the electrical parameter values.

11. The method as claimed in claim 8, wherein the overlapping region has a net doping concentration which is lower than the first well region and the second well region.

12. The method as claimed in claim 8, wherein the overlapping region has a non-uniform doping profile in a vertical direction from the surface to the substrate, wherein the net doping concentration at the overlapping region decreases from the first well boundary to the second well boundary, wherein a slope of the net doping concentration in the horizontal direction changes from high to low and then high towards the second well region.

13. The method as claimed in claim 8, further comprising:
forming an LDD region, which is just adjacent to the source region, formed by being doped in the same type as the source region,
wherein the LDD region has lower doping concentration than the source region,
wherein at least part of the LDD region is located beneath the gate electrode.

14. The method as claimed in claim 8, further comprising:
forming a separating unit disposed of next to the drain region.

15. The method as claimed in claim 14, wherein the separating unit comprises a shallow trench isolation (STI) region which has lower depth than the second well region.

16. The method as claimed in claim 8, wherein the overlapping region is characterized by changing space gradient of the doping concentration within the region, the space gradients of the net doping concentration at the overlapping region near the 1st and $2^{nd}$ wells are high, while the space gradient in the middle of the overlapping region is low, a low space gradient region is wider than a high space gradient region at the overlapping region.

17. The method as claimed in claim 8, wherein the electrical parameter values include design targets of the nEDMOS.

18. The method as claimed in claim 12, wherein the horizontal direction is the channel-length direction at the overlapping region.

* * * * *